United States Patent
Tang et al.

(10) Patent No.: US 8,957,470 B2
(45) Date of Patent: Feb. 17, 2015

(54) INTEGRATION OF MEMORY, HIGH VOLTAGE AND LOGIC DEVICES

(75) Inventors: Yan Zhe Tang, Singapore (SG); Shyue Seng Tan, Singapore (SG); Ying Keung Leung, Singapore (SG); Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 102 days.

(21) Appl. No.: 13/526,550

(22) Filed: Jun. 19, 2012

(65) Prior Publication Data

US 2013/0334584 A1    Dec. 19, 2013

(51) Int. Cl.
*H01L 29/788* (2006.01)

(52) U.S. Cl.
USPC .......................................................... 257/315

(58) Field of Classification Search
CPC ................ H01L 21/823462; H01L 27/115; H01L 27/10894; H01L 27/11546; H01L 27/11531

USPC .......................................................... 257/315
See application file for complete search history.

(56) References Cited

U.S. PATENT DOCUMENTS

| | | | |
|---|---|---|---|
| 2006/0160311 A1* | 7/2006 | Rao et al. | 438/275 |
| 2007/0224746 A1* | 9/2007 | Zhou | 438/197 |
| 2008/0173947 A1* | 7/2008 | Hou et al. | 257/369 |
| 2009/0230479 A1* | 9/2009 | Hsu et al. | 257/369 |
| 2010/0173471 A1* | 7/2010 | Sugimae et al. | 438/439 |
| 2011/0003467 A1* | 1/2011 | Kanda | 438/585 |

* cited by examiner

*Primary Examiner* — Andy Huynh
*Assistant Examiner* — Sitaramarao S Yechuri
(74) *Attorney, Agent, or Firm* — Horizon IP Pte Ltd

(57) ABSTRACT

A device and methods for forming a device are disclosed. The device includes a substrate having first, second and third regions. The first region includes a memory cell region, the second region includes a peripheral circuit region and the third region includes a logic region. A memory cell which includes a memory transistor having a first stack height ($T_{SM}$) is disposed in the first region. A high voltage (HV) transistor having a second stack height ($T_{SHV}$) is disposed in the second region and a logic transistor having a third stack height ($T_{SL}$) is disposed in the third region. The first, second and third stack heights are substantially the same across the substrate.

20 Claims, 28 Drawing Sheets

INTEGRATION OF MEMORY, HIGH VOLTAGE AND LOGIC DEVICES

BACKGROUND

As technology evolves into era of sub-micron (e.g., 65 nm and beyond), there is a desire to integrate memory array, high voltage (HV) devices and high speed logic circuit elements into a single chip or integrated circuit (IC) to form an embedded memory. Nevertheless, it is difficult to integrate these different types of devices in a single chip since each of these devices has different requirements. For example, it is necessary to alter or change the logic processing steps to accommodate for the memory cell and the high voltage devices. This undesirably complicates the manufacturing process and increases the manufacturing cost. Moreover, the reliabilities of the memory and high voltage devices may degrade during integration.

From the foregoing discussion, it is desirable to provide a reliable, high performing and simplified solution for integrating different types of devices in the same IC.

SUMMARY

Embodiments generally relate to semiconductor devices. In one embodiment, a device is disclosed. The device includes a substrate having first, second and third regions. The first region includes a memory cell region, the second region includes a peripheral circuit region and the third region includes a logic region. A memory cell which includes a memory transistor having a first stack height ($T_{SM}$) is disposed in the first region. A high voltage (HV) transistor having a second stack height ($T_{SHV}$) is disposed in the second region and a logic transistor having a third stack height ($T_{SL}$) is disposed in the third region. The first, second and third stack heights are substantially the same across the substrate.

In another embodiment, a method for forming a device is presented. The method includes providing a substrate having first, second and third regions. The first region includes a memory cell region, the second region includes a peripheral circuit region and the third region includes a logic region. A memory cell is formed in the first region. The memory cell includes a memory transistor having a first stack height ($T_{SM}$). A high voltage (HV) transistor having a second stack height ($T_{SHV}$) is formed in the second region and a logic transistor having a third stack height ($T_{SL}$) is formed in the third region. The first, second and third stack heights are substantially the same across the substrate.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the invention are described with reference to the following drawings, in which.

DETAILED DESCRIPTION

Embodiments generally relate to devices having non-volatile memory cells integrated with logic and high voltage devices. More particularly, the embodiments relate to non-volatile memory cells, logic and HV devices having substantially the same stack height across the same device. Such devices can be incorporated into integrated circuits (ICs) and easily integrated into logic processing technologies without compromising the reliabilities of the different devices. Such ICs may be used in, for example, embedded flash technology or other types of technology. The ICs can be incorporated into or used with, for example, microcontrollers, communication systems, consumer products such as cell phones, memory cards, smart cards, etc.

Figure 1:
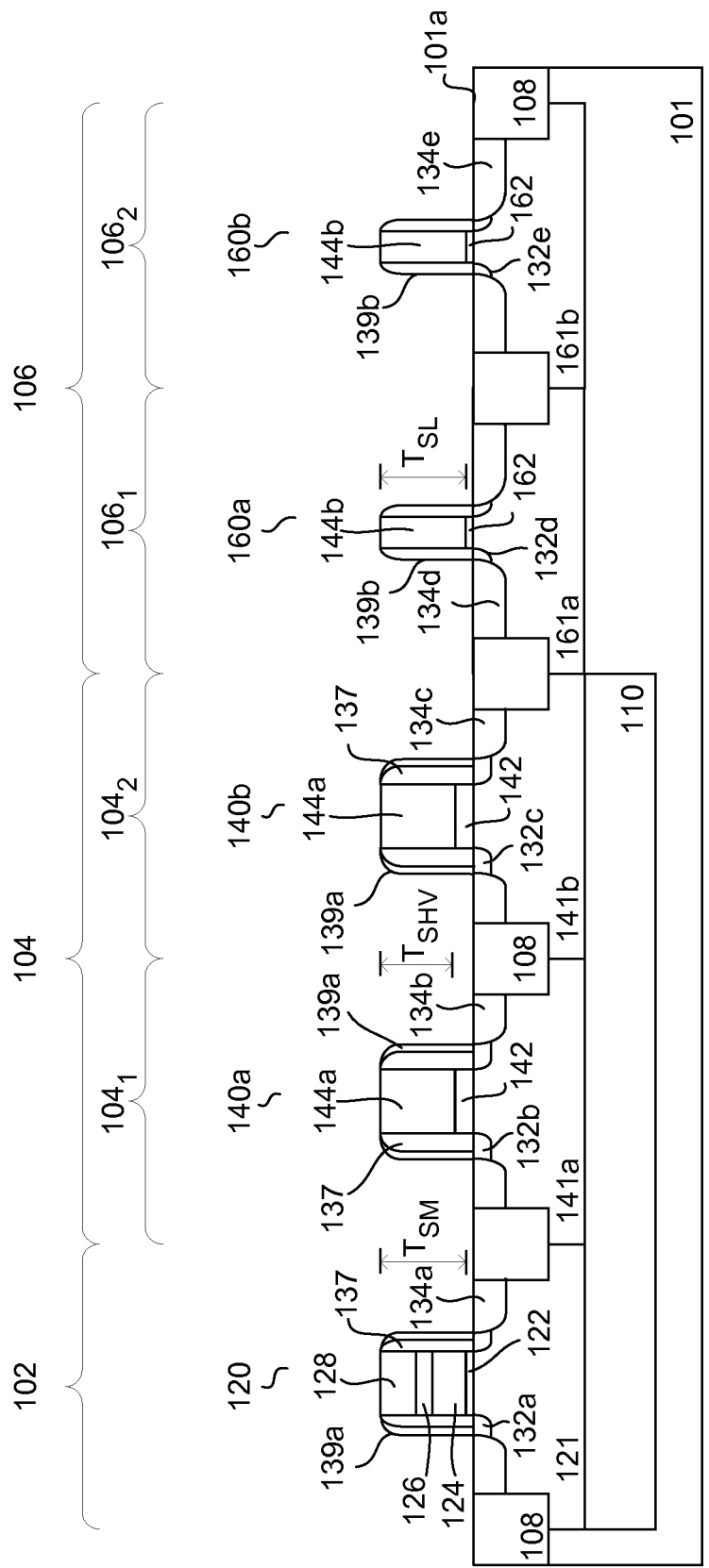
FIG. 1 shows a portion of an embodiment of a semiconductor device.

FIG. 1 shows a portion of an embodiment of a device 100. As shown, the portion includes a substrate 101. The substrate, for example, includes a silicon substrate. Other types of semiconductor substrates, for example, SiGe, SiGeC, SiC, silicon-on-insulators (SOIs), SiGe-on-insulators (SGOIs), are also useful. The substrate, for example, includes a lightly doped substrate. The substrate may be lightly doped with first type dopants, such as p-type dopants, forming a lightly-doped p-type substrate. Providing other types of substrates may also be useful. For example, the substrate may be doped with second type dopants, such as n-type dopants and/or other dopant concentrations, including intrinsically doped substrates.

The substrate, for example, includes first, second and third regions. In one embodiment, the first region 102 includes a memory cell region. As shown, the memory cell region is provided on the substrate on which a non-volatile memory cell is formed. The memory cell region, for example, is a part of an array region with a plurality of cell regions on which memory cells are formed to create a memory array. The second region 104, in one embodiment, includes a peripheral circuit region on which HV devices are formed. The second region, as shown, includes first $104_1$ and second $104_2$ sub-regions. The third region 106, in one embodiment, includes a logic region on which logic circuitry or devices are formed. As shown, the third region includes first $106_1$ and second $106_2$ sub-regions. Illustratively, the substrate is provided with one memory cell region, one peripheral circuit region and one logic region. The substrate may include other numbers of regions or sub-regions.

The substrate includes isolation region 108, such as shallow trench isolation (STI) regions, to separate the different regions as well as the sub-regions. Other types of isolation regions are also useful.

A deep well 110, for example, may optionally be provided in the substrate, encompassing the first and second regions of the substrate. For example, a deep well is disposed in the substrate in areas where memory cell and HV devices are formed. In one embodiment, the deep well includes dopants of the opposite type as the type of a memory cell well. In the case of a first type memory cell well, the deep well includes a second type. For illustration, second type dopants include n-type while first type dopants include p-type. P-type dopants may include boron (B), aluminum (Al), indium (In), etc., or a combination thereof, while n-type dopants may include phosphorus (P), arsenic (As), antimony (Sb), etc., or a combination thereof. For example, a p-type memory cell device will have a n-type deep well. In one embodiment, the deep well includes n-type dopants, such as P. The deep well, for example, includes a dopant concentration of about $10^{17}$-$10^{18}$ atom/cm$^3$ and has a depth of about 1-2 μm from a first substrate surface 101a. Other types of dopants, concentration and depths dimensions may also be useful.

The first region 102, in one embodiment, includes a memory cell region. In one embodiment, the memory cell region includes a first type memory well 121. For example, the memory cell region includes a p-type memory cell well. In other embodiment, providing a n-type memory cell well is also useful. The memory cell well, for example, includes p-type dopants having a dopant concentration of about $10^{17}$-$10^{18}$ atom/cm$^3$ and to a depth of about 0.1-0.2 μm from the first substrate surface. Other types of dopants, concentration and depths may also be useful. The memory cell well, for example, defines the type of memory cell. A first type memory cell well defines a second type memory cell. For example, a p-type memory cell well would have a n-type memory cell.

As shown, a second type memory cell, such as n-type, is disposed in the p-type memory cell well. The second type memory cell, in one embodiment, includes an electrically erasable programmable read only memory (EEPROM) cell. The memory cell includes a first transistor 120. The first transistor, for example, includes a floating gate transistor. The first transistor includes a first gate electrode 124 over a first gate dielectric 122. The first gate electrode, for example, corresponds to a floating gate (FG) and includes polysilicon. Other suitable types of gate electrode materials may also be useful. Furthermore, the first gate electrode may be doped with dopants. The first gate electrode, for example, may be doped with the same dopant type of the transistor type. Doping the first gate electrode with other dopant types is also useful. The first gate dielectric, for example, corresponds to a tunneling oxide and includes silicon oxide. Other suitable types of first gate dielectric materials may also be used. In one embodiment, the thickness of the first gate electrode and the first gate dielectric is about 300-600 Å and 80-100 Å, respectively. For example, the thickness of the first gate electrode is about 500 Å and the thickness of the first gate dielectric is about 90 Å. Other thicknesses may also be useful.

The first transistor 120 further includes a second gate electrode 128 over the first gate electrode 124. The second gate electrode, for example, corresponds to a control gate (CG) and includes polysilicon. Other suitable types of second gate electrode materials, such as metals are also useful. Furthermore, the second gate electrode may be doped with dopants. The second gate electrode, for example, may be doped with the same dopant type of the transistor type. Doping the second gate electrode with other dopant types is also useful. The second gate electrode, for example, includes a heavily doped polysilicon layer having a dopant concentration of about $10^{19}$-$10^{22}$ atom/cm$^3$. Other dopant concentrations may also be useful. In one embodiment, the initial thickness of the second gate electrode is about 500 Å. Other thicknesses may also be useful.

An isolation layer 126 is disposed in between the first and second gate electrodes. The isolation layer, for example, may include various types of dielectric materials. In one embodiment, the isolation layer includes a multi-layered stack or a composite stack layer, such as an oxide-nitride-oxide (ONO) trilayer. The ONO trilayer includes a lower oxide layer, an upper oxide layer, and a nitride layer sandwiched therebetween. Other dielectric materials may also be used. Additionally, the isolation layer may include one, two or more layers. For example, a bilayer isolation layer which includes a nitride layer and an oxide layer can be used. The isolation layer serves to separate the first gate electrode layer from the second gate electrode. For illustration, the lower oxide layer is about 50 Å thick, the nitride layer is about 50 Å thick, and the upper oxide layer is about 50 Å thick. For example, the isolation layer has a thickness of about 150 Å. Other thicknesses may also be useful.

The memory cell, as described, includes a stack height ($T_{SM}$) of about 600-2000 Å. For example, the $T_{SM}$ is about 900 Å. Other thicknesses may also be useful. The $T_{SM}$, in one embodiment, is defined as the total thickness of the first gate electrode, isolation layer and the final thickness of the second gate electrode.

The second region 104, in one embodiment, includes a peripheral circuit region on which HV devices are formed. The second region, in one embodiment, includes first 104$_1$ and second 104$_2$ sub-regions. The first and second sub-regions include first 140a and second 140b type transistors. The first and second type transistors are complementary types. For example, the first and second transistors include complementary HV devices. Forming non-complementary or other types of devices is also useful.

The first sub-region 104$_1$, in one embodiment, includes a first type peripheral circuit well 141a while the second sub-region 104$_2$ includes a second type peripheral circuit well 141b. For example, the first sub-region includes a p-type well and the second sub-region includes a n-type well. Other configurations of the sub-regions are also useful. For example, p-type dopants, such as B, are implanted into the first sub-region. The first peripheral circuit well, for example, includes p-type dopants having a dopant concentration of about $10^{17}$-$10^{18}$ atom/cm$^3$ and to a depth of about 0.3-0.5 μm from the first substrate surface. The second peripheral circuit well, for example, includes n-type dopants, such as P, having a dopant concentration of about $10^{17}$-$10^{18}$ atom/cm$^3$ and to a depth of about 0.3-0.5 μm from the first substrate surface. Other types of dopants, concentration and depths may also be useful. The type of well, for example, defines the type of HV device. A first type well defines a second type HV device. For example, a p-type well would have a n-type HV device.

A second type HV transistor is disposed in the first type well of the first sub-region and a first type HV transistor is disposed in the second type well of the second sub-region. For example, a n-type HV transistor is disposed in a p-type well of the first sub-region while a p-type HV transistor is disposed in a n-type well of the second sub-region.

A HV transistor, for example, includes a gate electrode 144a over a gate dielectric 142. The gate electrode, for example, includes polysilicon. Other types of gate electrode materials, such as polysilicide or metal silicide, are also useful. Furthermore, the gate electrode may be doped with dopants. Doping the gate electrode may depend on the technology. The gate electrode, for example, may be doped with the same dopant type of the transistor type. Doping the gate electrode with other dopant types is also useful. The thickness of the HV gate electrode, for example, may be about 600-2000 Å. For example, the thickness of the HV gate electrode is about 800 Å. Other thicknesses may also be useful. The thickness of the HV gate electrode defines the stack height ($T_{SHV}$) of the HV transistor. The gate dielectric 142, for example, includes silicon oxide. Other types of gate dielectric materials can also be used. The gate dielectric includes a thickness of about 150-250 Å. Other thicknesses may also be useful.

Sidewalls of the memory and HV gate stacks are provided with sidewall spacer elements. In one embodiment, the sidewalls of the memory and HV gate stacks are provided with first spacer elements 137 and second spacer elements 139 disposed over the first spacer elements. The first sidewall spacers, for example, include a dielectric material, such as silicon oxide, silicon nitride or a combination thereof. Other types of materials can be used for the first sidewall spacers. The thickness of the first spacer elements, for example, is about 300-1000 Å. Other thicknesses may also be useful. In one embodiment, the second spacer elements may include different type of material than the first spacer elements. Providing the same dielectric material for both first and second spacer elements may also be useful. The thickness of the second spacer elements, for example, is about 200-800 Å. Other thicknesses may also be useful.

The third region 106, in one embodiment, includes a logic region on which logic devices are formed. The third region, in one embodiment, includes first 106$_1$ and second 106$_2$ sub-regions. The first and second sub-regions include first and second types transistors. The first and second type transistors are complementary types. For example, the first and second transistors include complementary logic devices. Forming non-complementary or other types of devices is also useful.

The first sub-region 106$_1$, in one embodiment, includes a first type logic well 161a while the second sub-region 106$_2$ includes a second type logic well 161b. For example, the first sub-region includes a p-type well and the second sub-region includes a n-type well. Other configurations of the sub-regions are also useful. For example, p-type dopants, such as B, BF$_2$, etc., or a combination thereof, are implanted into the substrate. The first logic well, for example, includes p-type dopants having a dopant concentration of about $10^{17}$-$10^{18}$ atom/cm$^3$ and to a depth of about 0.3-0.5 μm from the first substrate surface. The second logic well, for example, includes n-type dopants, such as P, As, etc., or a combination thereof, having a dopant concentration of about $10^{17}$-$10^{18}$ atom/cm$^3$ and to a depth of about 0.3-0.5 μm from the first substrate surface. Other types of dopants, concentration and depths may also be useful. The type of well, for example, defines the type of logic device. A first type well defines a second type logic device. For example, a p-type well would have a n-type logic device.

A second type logic transistor 160a is disposed in the first type well of the first sub-region and a first type logic transistor 160b is disposed in the second type well of the second sub-region. For example, a n-type logic transistor is disposed in a p-type well of the first sub-region while a p-type logic transistor is disposed in a n-type well of the second sub-region.

A logic transistor, for example, includes a gate electrode 144b over a gate dielectric 162. The gate electrode of the logic transistor, for example, includes the same gate electrode material of the HV transistor. For example, the gate electrode of the logic transistor includes polysilicon. Other types of gate electrode materials, such as polysilicide or metal silicide, are also useful. Furthermore, the gate electrode may be doped with dopants. Doping the gate electrode may depend on the technology. The gate electrode, for example, may be doped with the same dopant type of the transistor type. Doping the gate electrode with other dopant types is also useful. The thickness of the gate electrode of the logic transistor, for example, is substantially the same as the thickness of the gate electrode of the HV transistor. For example, the thickness of the gate electrode of the logic transistor may be about 600-2000 Å. The thickness of the gate electrode, for example, is about 800 Å. Other thicknesses may also be useful. The thickness of the logic gate electrode defines the stack height ($T_{SL}$) of the logic transistor. The gate dielectric of the logic transistor, for example, includes silicon oxide. Other types of gate dielectric materials can also be used. The gate dielectric of the logic transistor includes a thickness of about 10-70 Å. Other thicknesses may also be useful.

Sidewalls of the logic gate stacks are provided with sidewall spacers. The sidewall spacers 139b of the logic gate stacks, for example, include the same material as the second spacer elements 139a of the memory and HV gate stacks. For example, the sidewall spacers of the logic gate stacks include dielectric material, such as silicon oxide, silicon nitride or a combination thereof. Other types of materials can be used for the first sidewall spacers. The thickness of the sidewall spacer elements, for example, is about 200-800 Å, which is substantially the same as the thickness of the second sidewall elements of the memory and HV gate stacks. Other thicknesses may also be useful.

Adjacent to the memory, HV and logic structures are diffusion regions 134a-e. The diffusion regions serve as, for example, source and drain regions of the transistors. Extension or lightly doped diffusion regions 132a-e are provided. The extension diffusion regions, for example, are shallow diffusion regions which extend under the spacers. The diffusion regions (including the extension diffusion regions) of the first type transistor are doped with the first type dopants and the diffusion regions of the second type transistor are doped with the second type dopants. For example p-type diffusion regions are provided for p-type transistors and n-type diffusion regions are provided for n-type transistors. The depth and dopant concentration of the diffusion regions may depend, for example, on the application, such as voltage requirements.

Although not shown, an interlevel dielectric (ILD) layer is provided over the transistors. Contacts (not shown) are provided, coupling the diffusion regions and gate electrodes to source lines, bit lines, access gate lines, control gate lines, etc.

The stack height variance between memory, HV and logic transistors which are formed using conventional design and processes at 40 nm technology node is about 100%. In other words, the stack height of the memory cell formed by conventional processes at 40 nm is about 2 times the stack heights of the HV and logic transistors. As described in the embodiment shown in FIG. 1, the stack heights of the memory cell ($T_{SM}$), the HV transistor ($T_{SHV}$) and the logic transistor ($T_{SL}$) are substantially the same across the same substrate of the semiconductor device. The stack height variance between the different devices as described, for example, is less than or about 10%. For illustration purpose, the stack height variance between the memory, HV and logic devices with respect to FIG. 1 is relatively small, for example, less than or about 100 Å. As such, the memory cell can be easily integrated into existing or other logic processing technologies. By forming memory cell and HV transistors having substantially the same stack height as the logic transistors, additional steps to alter the logic processes which are common to all other device processes, such as, contact etch, ILD and interconnect formations, are avoided. In addition, the process margin in the memory region is improved due to much smaller ILD aspect ratio with greatly reduced memory stack height, thus potentially shrinks the cell bit size further.

Moreover, the first spacer elements of the HV transistors are sufficiently wide to enable high breakdown voltage to be achieved to satisfy the requirements of the memory cell. As such, the reliability of the HV transistors is not compromised even though the thickness of the gate electrode of the HV transistor is reduced to accommodate for miniaturization of logic transistors to the 65 nm technology node and beyond. The high breakdown voltage alleviates the concern of reduced CG to FG coupling ratio due to a thinner FG. The reduced FG capacitance requires fewer electrons to be programmed and erased through the tunneling oxide to get the same voltage window. As such, the memory reliability and the data retention capabilities of the memory cell are improved.

Figure 2:
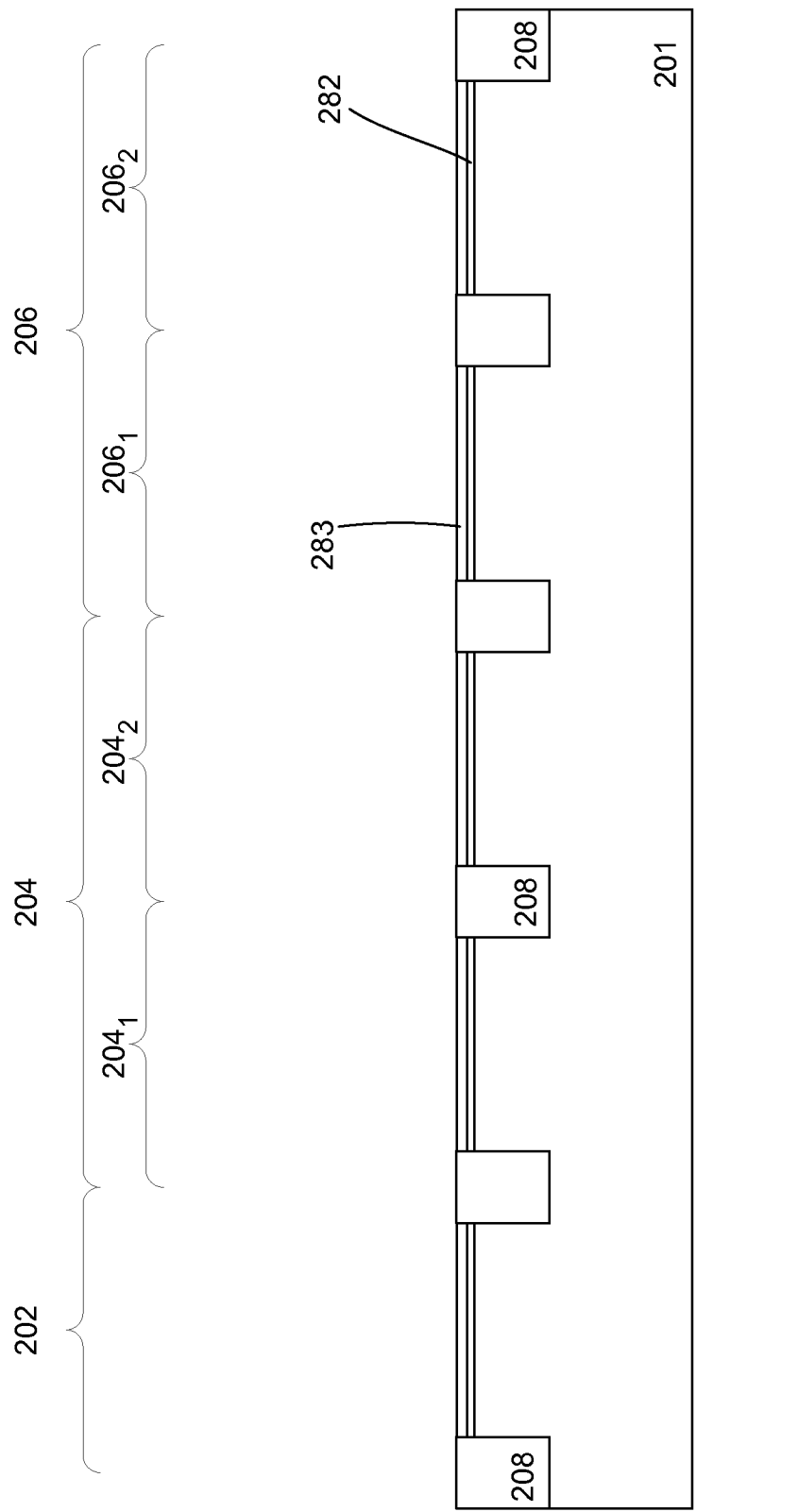
FIGS. 2-28 show an embodiment of a process for forming a semiconductor device.

FIGS. 2-28 illustrate an embodiment of a process 200 for forming a semiconductor device. Referring to FIG. 2, a substrate 201 is provided. The substrate includes a semiconductor substrate, such as silicon. Other types of semiconductor substrates, for example, SiGe, SiGeC, SiC, silicon-on-insulators (SOIs), SiGe-on-insulators (SGOIs), are also useful. The substrate, for example, includes a lightly doped substrate. The substrate may be lightly doped with first type dopants. The first type dopants, for example, include p-type dopants, forming a lightly-doped p-type substrate. Providing other types of substrates may also be useful. For example, the substrate may be doped with second type dopants, such as n-type dopants and/or other dopant concentrations, including intrinsically doped substrates.

As shown, the substrate is prepared with first, second and third regions. In one embodiment, the first region 202 includes a memory cell region. As shown, the memory cell region is provided on the substrate on which a memory cell 220 is formed. The memory cell region, for example, is a part of an array region with a plurality of cell regions on which memory cells are formed to create a memory array. The second region 204, for example, includes a peripheral circuit region on which HV devices 240a-b are formed. The second region, as shown, includes first $204_1$ and second $204_2$ sub-regions. The third region 206, for example, includes a logic region on which logic circuitry or devices 260a-b are formed. As shown, the third region includes first $206_1$ and second $206_2$ sub-regions. Illustratively, the substrate is provided with one memory cell region, one peripheral circuit region and one logic region. Providing a substrate with other numbers of regions or sub-regions may also be useful.

The substrate is prepared with isolation regions 208, such as shallow trench isolation (STI) regions, to separate the different regions as well as the sub-regions. Various processes can be employed to form the STI regions. For example, first and second pad layers may be provided on top of the substrate. The first pad layer 282, for example, includes a pad oxide layer while the second pad layer 283 includes a pad nitride layer. The substrate is etched using etch and mask techniques to form trenches which are then filled with dielectric material such as silicon oxide. Excess dielectric material is removed by, for example, chemical mechanical polishing (CMP), producing STI structures having top surfaces coplanar with the second pad layer. In one embodiment, the first and second pad layers are removed, producing STI structures having surfaces which are non co-planar with a first substrate surface. Other processes or materials can also be used to form the isolation regions.

A protection stack 284 having first and second protection layers and a first soft mask layer 285 are deposited on the substrate. The first protection layer 284a, for example, includes silicon oxide while the second protection layer 284b formed thereon includes silicon nitride. Various suitable techniques, such as CVD, may be used to form the protection stack. The thickness of the first protection layer, for example, is about 100-500 Å while the thickness of the second protection layer, for example, is about 300-1000 Å. Other thicknesses may also be useful so long as it is sufficiently thick to protect the underlying layers. The first soft mask layer, for example, includes a photoresist.

Figure 3:
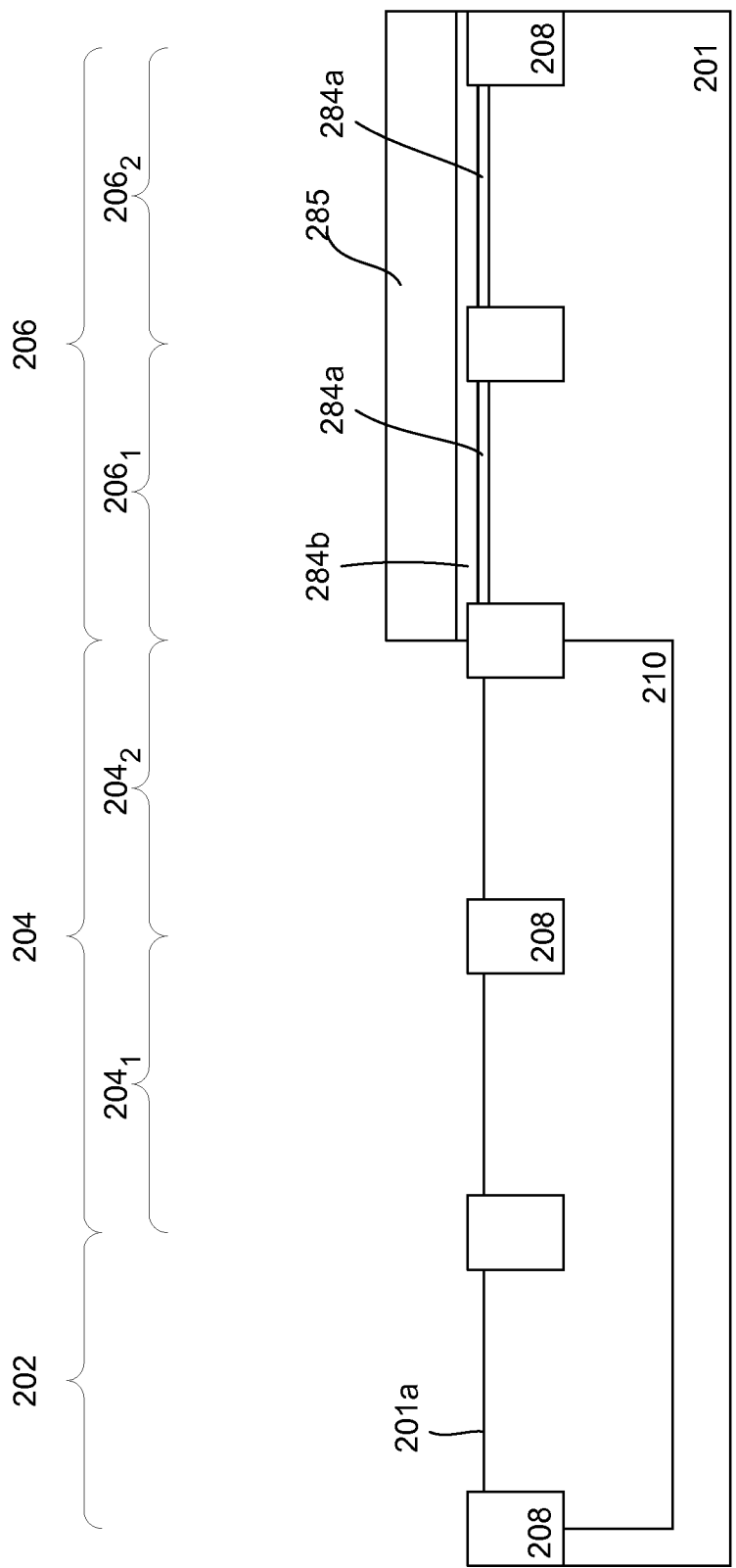

The first soft mask and the protection stack are patterned to form an opening to expose the first 202 and second 204 regions of the substrate. In one embodiment, the opening corresponds to the opening for a deep well implant. For example, the first soft mask and the protection stack serve as the deep well implant mask. The protection stack, in one embodiment, protects the third region 206. For example, the protection stack may be used to prevent the third region from being exposed during subsequent processing and to protect the third region from implant damage. As shown in FIG. 3, the substrate is implanted with dopants to form a deep well 210. In one embodiment, dopants of the opposite type as the type of the memory cell well are implanted. In the case of a first type memory cell well, the deep well includes a second type.

In one embodiment, n-type deep well is formed by implanting n-type dopants in the substrate in first and second regions where memory cell 220 and high voltage devices 240a-b are to be formed. In one embodiment, n-type dopants, such as P, are implanted into the substrate. The deep well, for example, is implanted with n-type dopants having a dopant concentration of about $10^{17}$-$10^{18}$ atom/cm$^3$ and to a depth of about 1-2 μm from the first substrate surface 201a. Providing other types of dopants, concentration and depths may also be useful.

The process continues by removing the first soft mask layer over the protection stack. The soft mask layer can be removed by, for example, an ashing process. Other types of techniques may also be useful.

Figure 4:
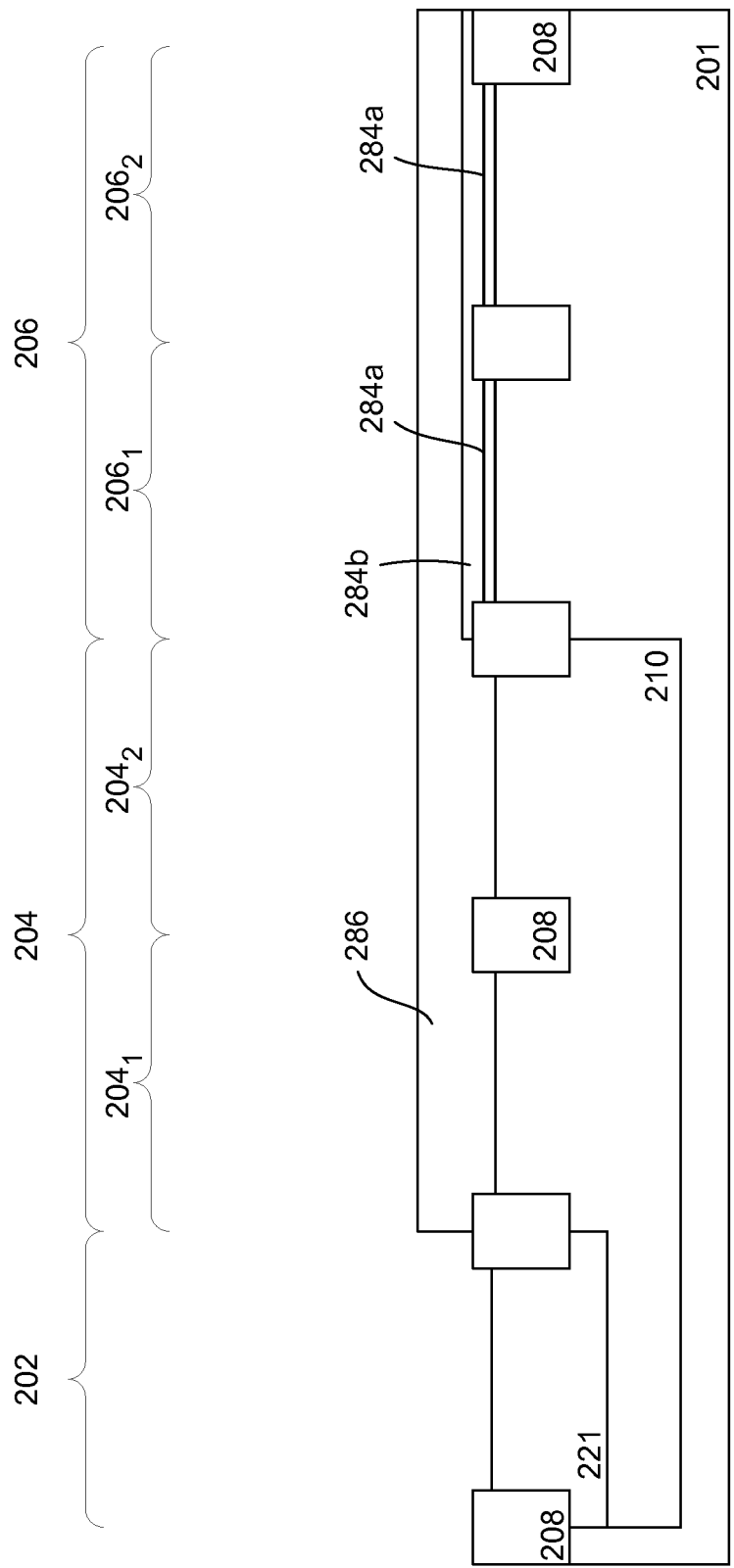

Referring to FIG. 4, a second soft mask layer 286 is provided over the substrate. The second soft mask is patterned to form an opening to expose the first region 202. In one embodiment, the opening corresponds to the opening for a memory cell well implant. For example, the soft mask serves as the memory well implant mask. As shown in FIG. 4, the substrate is implanted with first type dopants to form a first type memory cell well 221. For example, p-type dopants, such as B, are implanted into the substrate. The memory cell well, for example, is implanted with p-type dopants having a dopant concentration of about $10^{17}$-$10^{18}$ atom/cm$^3$ and to a depth of about 0.3-0.5 μm from the first substrate surface. Providing other types of dopants, concentration and depths may also be useful.

A first gate dielectric layer 222 is formed over the substrate. In one embodiment, the first gate dielectric layer includes a tunneling oxide layer. The tunneling oxide layer includes silicon oxide. Other types of dielectric materials may also be used to form the first gate dielectric layer. Alternatively, high-k or low-k or composite dielectric materials may be used. The thickness of the first gate dielectric layer may be about 80-100 Å. Other thicknesses may also be useful. In one embodiment, the first gate dielectric layer is blanket grown on the substrate. In one embodiment, the first gate dielectric layer is selectively grown on the first and second regions of the substrate. For example, the first gate dielectric layer is selectively grown on the exposed silicon surface of the first and second regions of the substrate. Other techniques may also be used to form the first gate dielectric layer.

The process continues to form a first gate electrode layer 224 on the first gate dielectric layer and the protection stack. The first gate electrode layer includes, in one embodiment, polysilicon. Other types of gate electrode materials are also useful. For example, the polysilicon can be implanted or in-situ doped with dopants such as P to form a doped polysilicon. The thickness of the gate electrode layer may be about 300-600 Å. For example, the thickness of the gate electrode layer 224 is about 500 Å. Other thicknesses are also useful. Various techniques can be used to form the first gate electrode layer. For example, polysilicon can be deposited by CVD. Other techniques, depending on the material, may also be useful.

A mask layer (not shown), such as a photoresist, is formed on the substrate. The mask is patterned as desired to serve as a first gate mask. For example, the mask is patterned to expose portions of the first gate electrode layer to be removed. The first gate mask protects portions of the first gate electrode layer over the memory cell region. As such, the exposed portions of the first gate electrode layer over the peripheral circuit and logic regions and portions of the first gate electrode layer over the memory cell region are removed. Removal of the exposed portions can be achieved using, for example, an anisotropic etch such as RIE. Other techniques may also be useful.

The process continues to form an isolation layer 226 over the first gate electrode layer on the substrate. Typically, the isolation layer is formed as a blanket layer on the substrate. The isolation layer, in one embodiment, includes a composite layer stack. In one embodiment, the composite layer stack includes an oxide-nitride-oxide (ONO) stack. Other types of isolation layers are also useful. Various techniques can be used to form the ONO stack. In one embodiment, a lower oxide layer is first formed. The lower oxide layer can be formed by, for example, high temperature oxide (HTO). Other techniques including, for example, low pressure chemical vapor deposition (LPCVD) and thermal oxidation are also useful. The physical thickness of the lower oxide layer, for example, may be about 50 Å. Next, a nitride layer is deposited. The thickness of the nitride layer, for example, may be about 50 Å. The nitride layer can be formed by LPCVD or nitridation. Other techniques are also useful. Finally, the top or upper oxide layer is formed. The thickness of the upper oxide layer, for example, may be about 50 Å. The upper oxide layer may be formed using the same techniques as for the lower oxide layer. For example, the isolation layer has a thickness of about 150 Å. Other thicknesses may also be useful. The isolation layer, in one embodiment, serves to separate the first gate electrode layer from a second gate electrode layer formed later.

A second gate electrode layer 228 is formed over the isolation layer and the substrate. The second gate layer, for example, includes a blanket gate layer. In one embodiment, the second gate layer includes polysilicon. The polysilicon gate layer can be formed by chemical vapor deposition (CVD). The polysilicon layer may be doped or in-situ doped with dopants such as P to form a doped polysilicon to impart a higher conductivity to the gate. The polysilicon layer, for example, includes a heavily doped polysilicon layer having a dopant concentration of about $10^{19}$-$10^{22}$ atom/cm$^3$. The dopant concentration, for example, may affect the oxidation rate of the second gate electrode layer. Other materials, dopant concentrations and techniques may also be used to form the second gate layer. An initial thickness of the second gate layer is, for example, about 500-1000 Å. For example, the initial thickness of the second gate layer is about 500 Å. Other thicknesses may also be useful.

Figure 5:
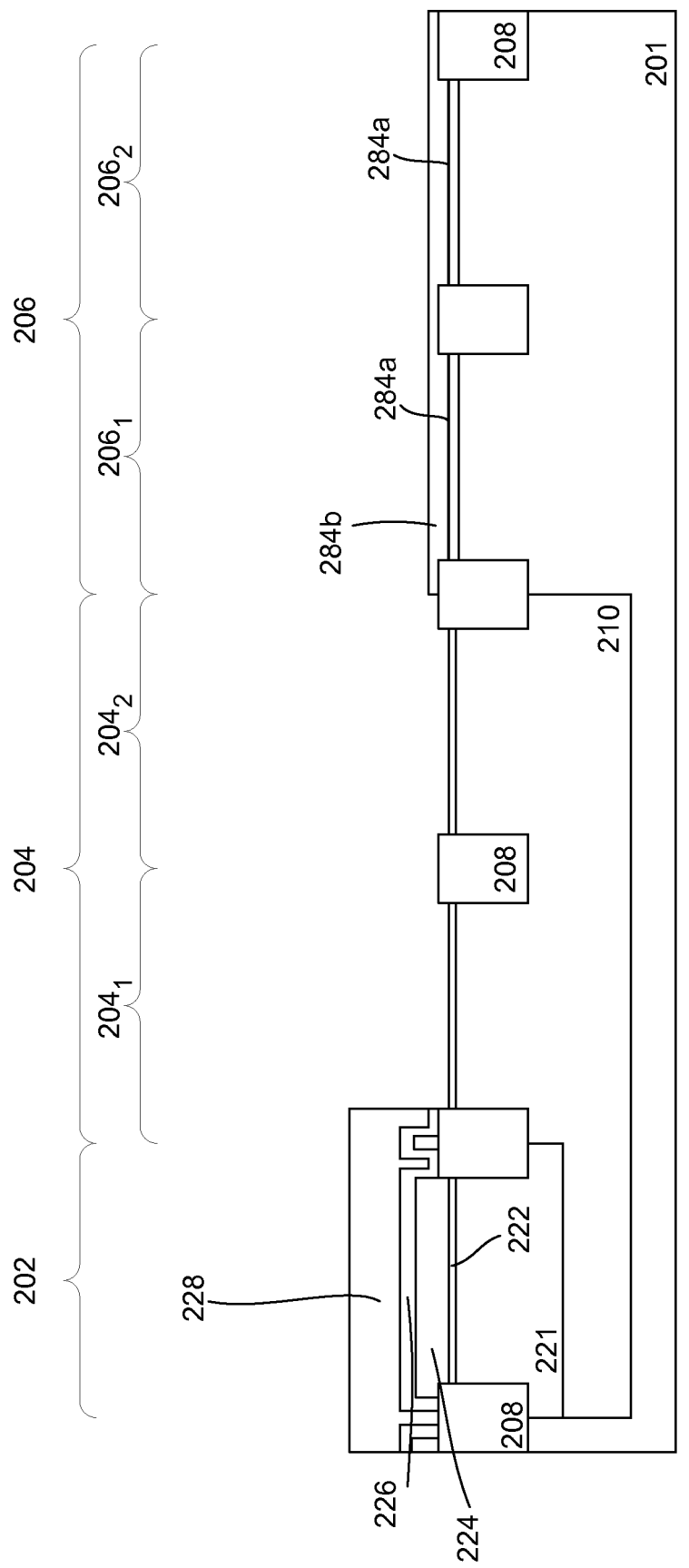

Referring to FIG. 5, the second gate layer and the storage layer beneath it are patterned. For example, a photoresist layer (not shown) is deposited on top of the second gate layer. The photoresist layer is patterned to expose portions of the second gate layer. For example, the second gate layer on the peripheral circuit and logic regions are exposed. The exposed second gate layer and the storage layer beneath it are removed to form an interim gate structure as shown in FIG. 5. Removal can be achieved using, for example, an anisotropic etch such as RIE. Other techniques may also be useful.

In one embodiment, the interim structure includes a first sidewall which is substantially parallel with a first sidewall of the memory cell well. A second sidewall of the resulting structure, for example, is substantially parallel with a sidewall of an STI separating the memory cell and peripheral region and the STI sidewall is adjacent to the peripheral region. The remaining portions of the photoresist layer on the top of the interim structure are removed after etching.

Figure 6:
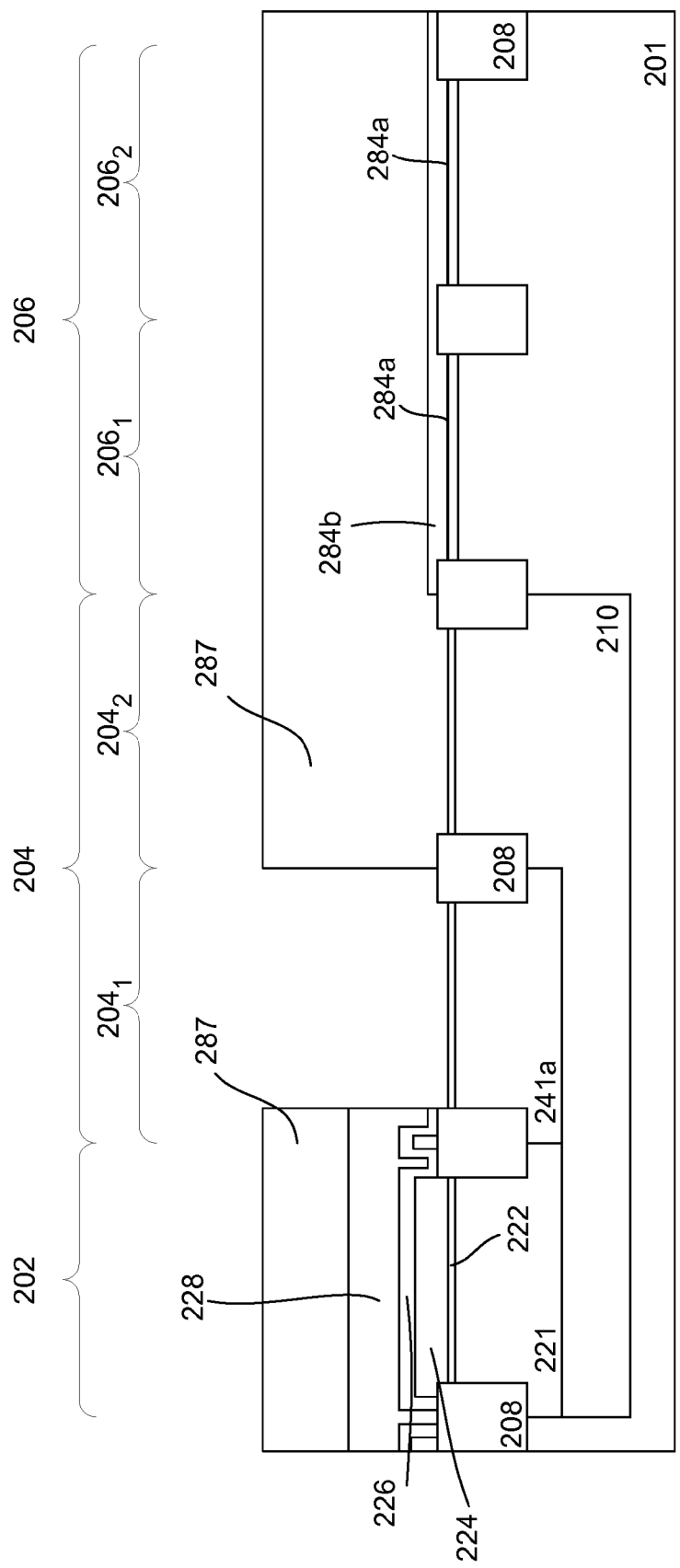

Referring to FIG. 6, a third soft mask layer 287 is provided over the substrate. The third soft mask is patterned to form an opening to expose the first sub-region 204$_1$ of the second region 204. In one embodiment, the opening corresponds to the opening for a first peripheral circuit well implant. For example, the soft mask serves as the first peripheral circuit well implant mask. As shown in FIG. 6, the substrate is implanted with first type dopants to form a first type peripheral circuit well 241a. For example, p-type dopants, such as B, are implanted into the substrate. The first peripheral circuit well, for example, is implanted with p-type dopants having a dopant concentration of about $10^{17}$-$10^{18}$ atom/cm$^3$ and to a depth of about 0.3-0.5 μm from the first substrate surface. Providing other types of dopants, concentration and depths may also be useful.

The process continues by removing the third soft mask layer. The soft mask layer can be removed by, for example, an ashing process. Other types of techniques may also be useful.

Figure 7:
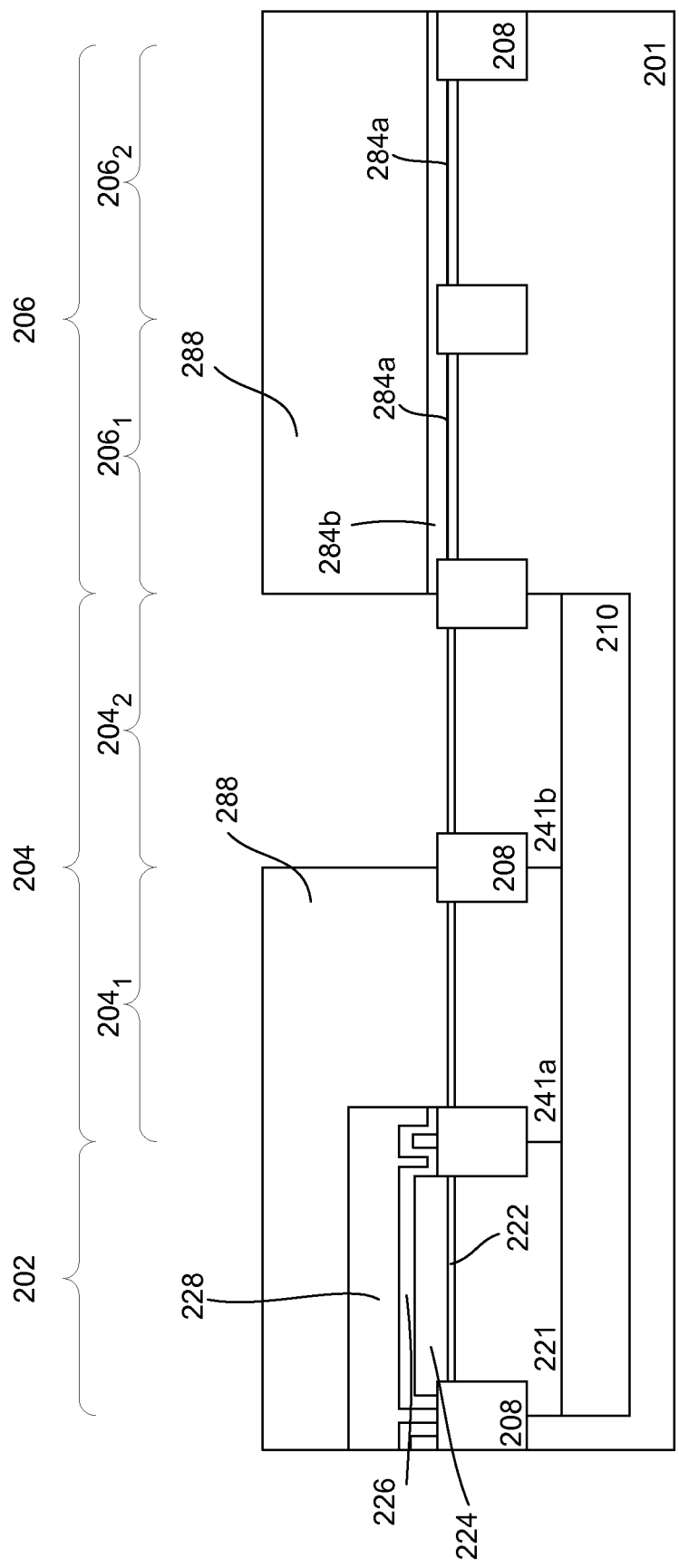

A fourth soft mask layer 288 is provided over the substrate as shown in FIG. 7. The fourth soft mask is patterned to form an opening to expose the second sub-region 204$_2$ of the second region 204. In one embodiment, the opening corresponds to the opening for a second peripheral circuit well implant. For example, the fourth soft mask serves as the second peripheral circuit well implant mask. Referring to FIG. 7, the substrate is implanted with second type dopants to form a second type peripheral circuit well 241b. For example, n-type dopants, such as P, are implanted into the substrate. The second peripheral circuit well, for example, is implanted with n-type dopants having a dopant concentration of about $10^{17}$-$10^{18}$ atom/cm$^3$ and to a depth of about 0.3-0.5 μm from the first substrate surface. Providing other types of dopants, concentration and depths may also be useful.

Figure 8:
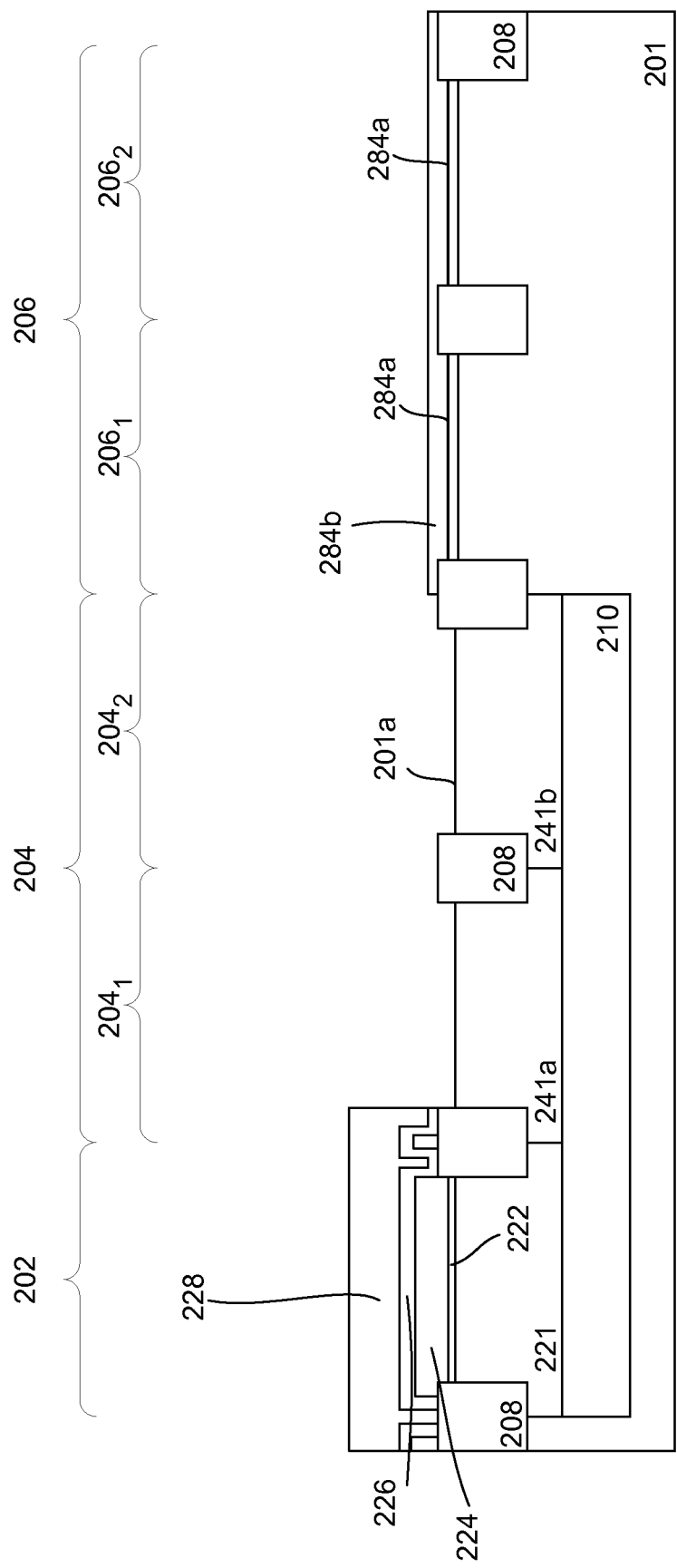

The fourth soft mask layer is removed. The fourth soft mask layer can be removed by, for example, an ashing process. Other types of techniques may also be useful. Furthermore, the first gate dielectric layer and oxide residue over the second region 204 of the substrate are removed as shown in FIG. 8. For example, the oxide residue is removed by HF, exposing the first substrate surface 201a. Other suitable techniques may also be used to remove the oxide residue.

Figure 9:
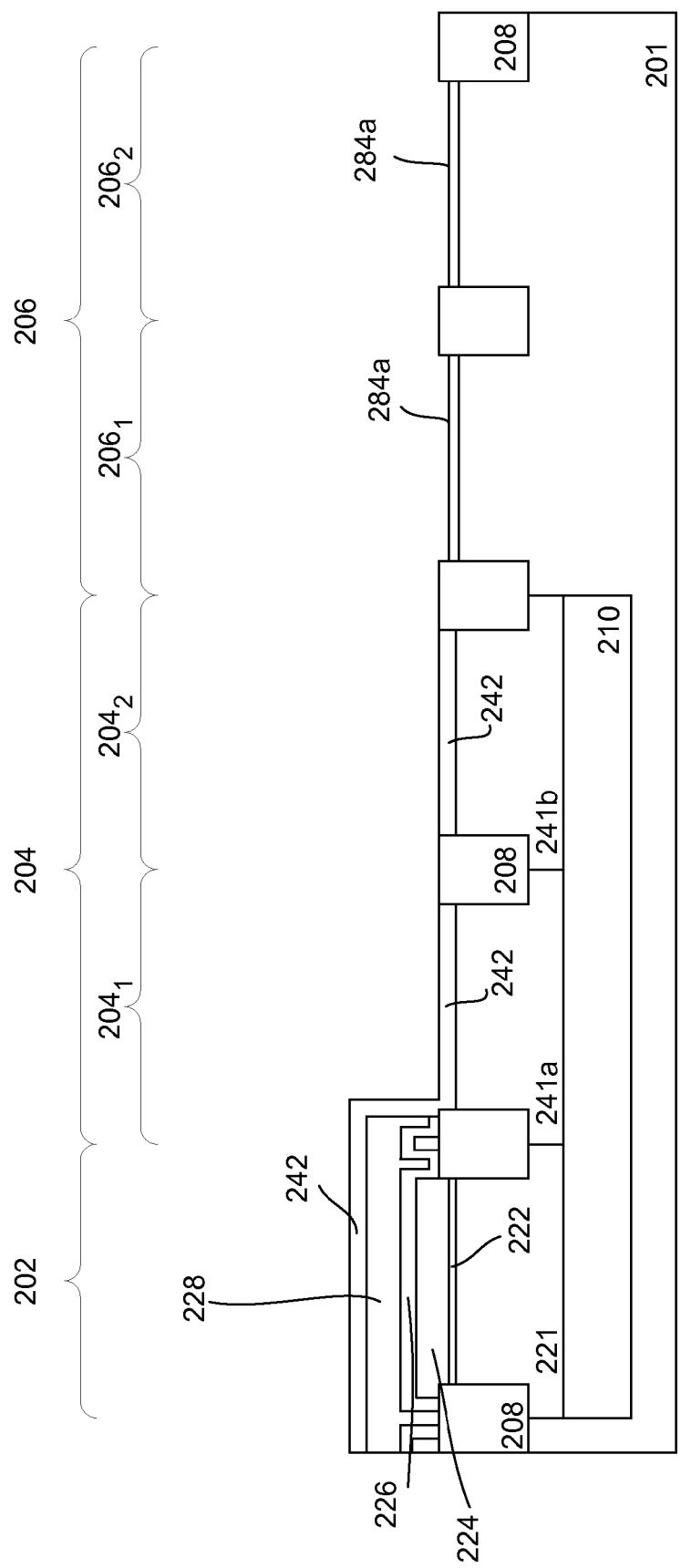

Referring to FIG. 9, the second protection layer 284b of the protection stack over the logic region is removed. For example, the second protection layer is removed by H$_3$PO$_4$, exposing the first protection layer 284a. Other suitable techniques may also be used to remove the second protection layer.

The process continues to form a second gate dielectric layer 242 over the substrate. For example, the second gate dielectric layer includes an oxide. The oxide layer is formed using a high temperature wet oxidation. The high temperature wet oxidation may be performed, for example, at about 700-1000 C. Other temperature ranges may also be useful. The oxide layer is grown with varying thicknesses over the different regions of the substrate. For example, the thickness of the oxide layer over the second gate layer on the memory cell region is the thickest relative to the other regions. For example, the thickness of the oxide layer on the second gate layer is about 400-1000 Å. The thickness of the oxide layer, for example, is about 400 Å. This is because the oxidation rate on the second gate layer, such as the heavily doped polysilicon layer, is much faster relative to the other regions on the substrate. The final thickness of the second gate layer after high temperature wet oxidation, for example, is about 250 Å. Other thickness dimensions for the final thickness may also be useful. The oxide layer over the peripheral circuit regions, for example, has a thickness of about 150-200 Å while the oxide layer over the logic region, for example, has a thickness of about 5-50 Å. As described, the oxide layer over the logic region is the thinnest since it is formed over the first protection layer which includes a silicon oxide. As such, the first protection layer serves to prevent or minimize formation of oxide layer over the logic region.

Figure 10:
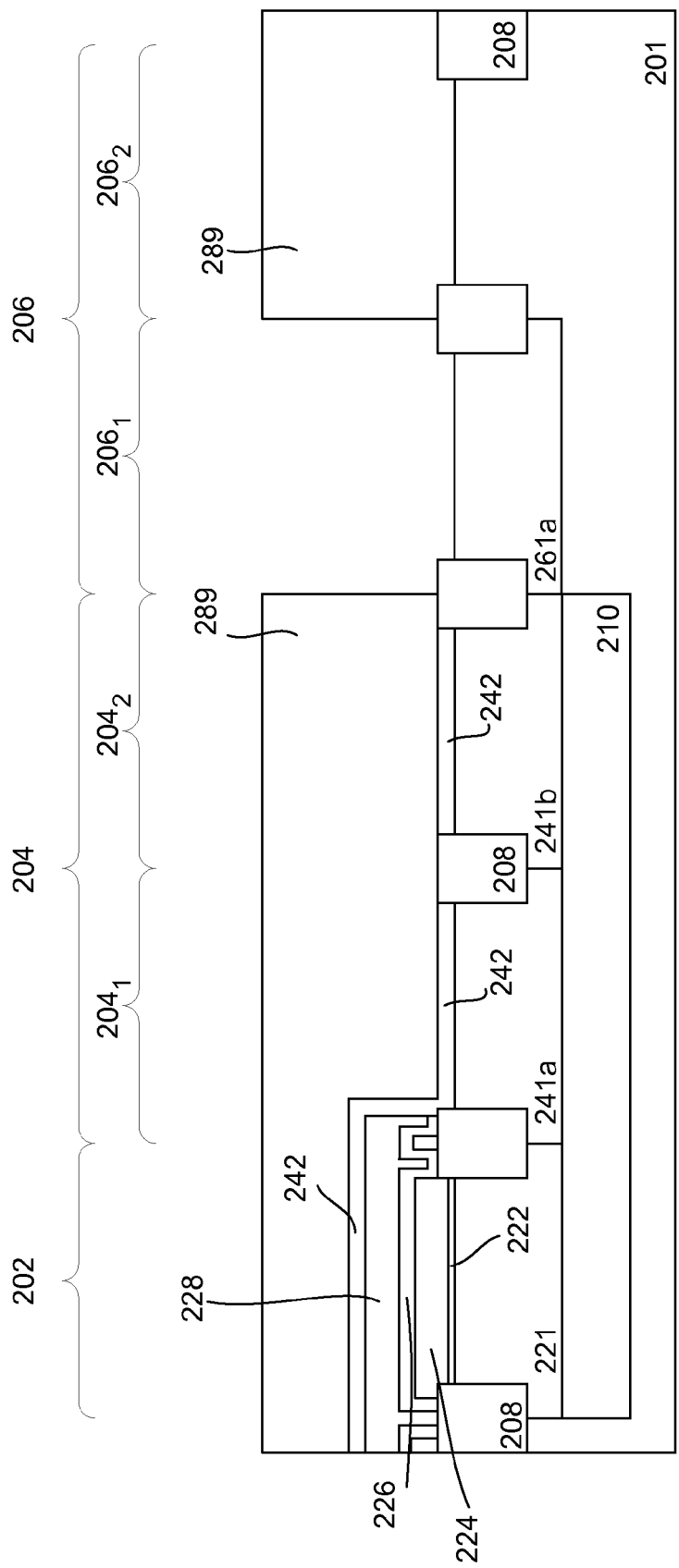

Referring to FIG. 10, a fifth soft mask layer 289 is provided over the substrate. The fifth soft mask is patterned to form an opening to expose the first sub-region 206₁ of the third region. In one embodiment, the opening corresponds to the opening for a first logic well implant. For example, the fifth soft mask serves as a first logic well implant mask. Referring to FIG. 10, the substrate is implanted with first type dopants to form a first type logic well 261a. For example, p-type dopants, such as B, $BF_2$, etc., or a combination thereof, are implanted into the substrate. The first logic well, for example, is implanted with p-type dopants having a dopant concentration of about $10^{17}$-$10^{18}$ atom/cm³ and to a depth of about 0.3-0.5 μm from the first substrate surface. Providing other types of dopants, concentration and depths may also be useful.

The fifth soft mask layer is removed. The fifth soft mask layer can be removed by, for example, an ashing process. Other types of techniques may also be useful.

Figure 11:
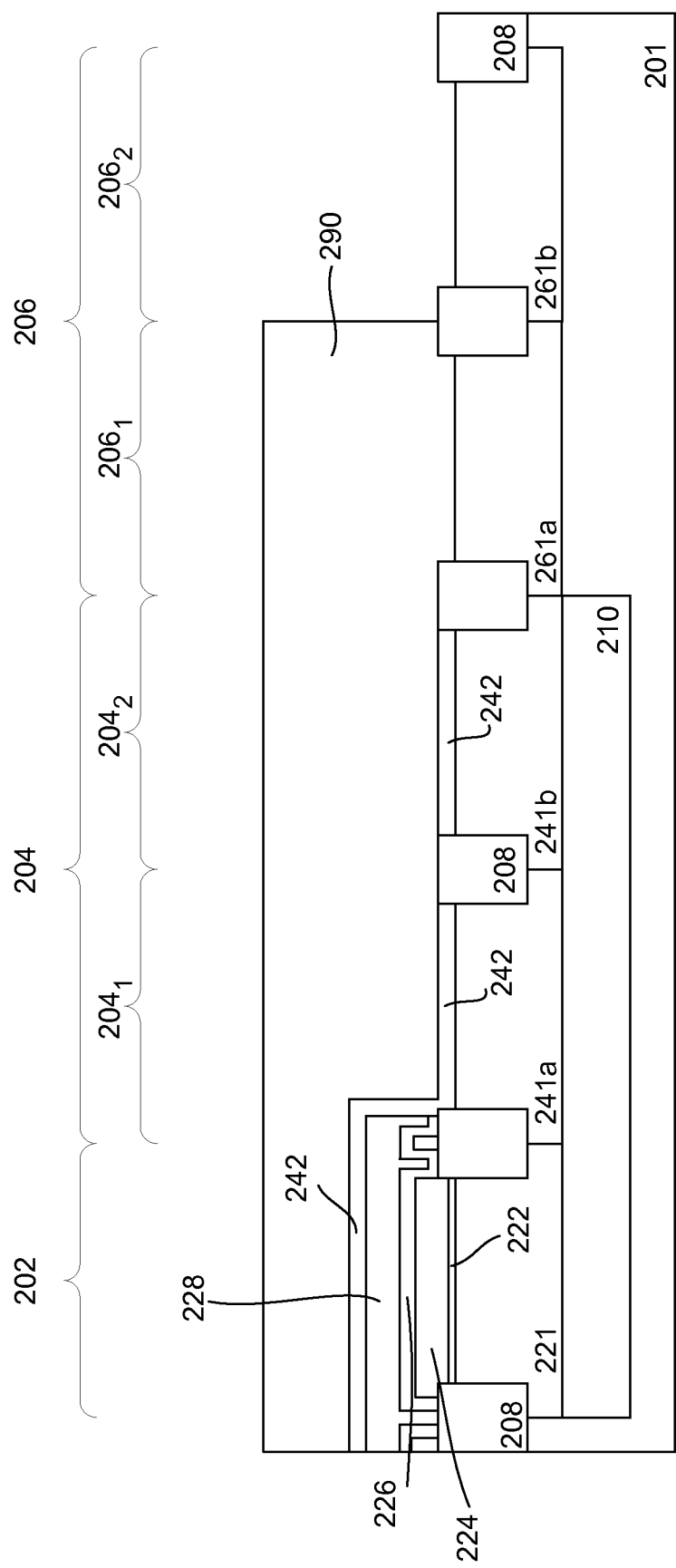

A sixth soft mask layer 290 is provided over the substrate as shown in FIG. 11. The sixth soft mask is patterned to form an opening to expose the second sub-region 206₂ of the third region 206. In one embodiment, the opening corresponds to the opening for a second logic well implant. For example, the sixth soft mask serves as the second logic well implant mask. As shown in FIG. 11, the substrate is implanted with second type dopants to form a second type logic well 261b. For example, n-type dopants, such as P, As, etc., or a combination thereof, are implanted into the substrate. The second logic well, for example, is implanted with n-type dopants having a dopant concentration of about $10^{17}$-$10^{18}$ atom/cm³ and to a depth of about 0.3-0.5 μm from the first substrate surface. Providing other types of dopants, concentration and depths may also be useful. The sixth soft mask layer is removed. The sixth soft mask layer can be removed by, for example, an ashing process or other suitable techniques.

The process continues by forming a mask layer (not shown) over the substrate. The mask layer is patterned to form an opening to expose the first protection layer 284a over the logic region. In one embodiment, the opening corresponds to the opening for removing the first protection layer. For example, the mask serves as an etch mask to remove the first protection layer over the logic region. The first protection layer is removed by any suitable etch techniques. As such, the first protection layer serves as a sacrificial oxide layer.

Figure 12:
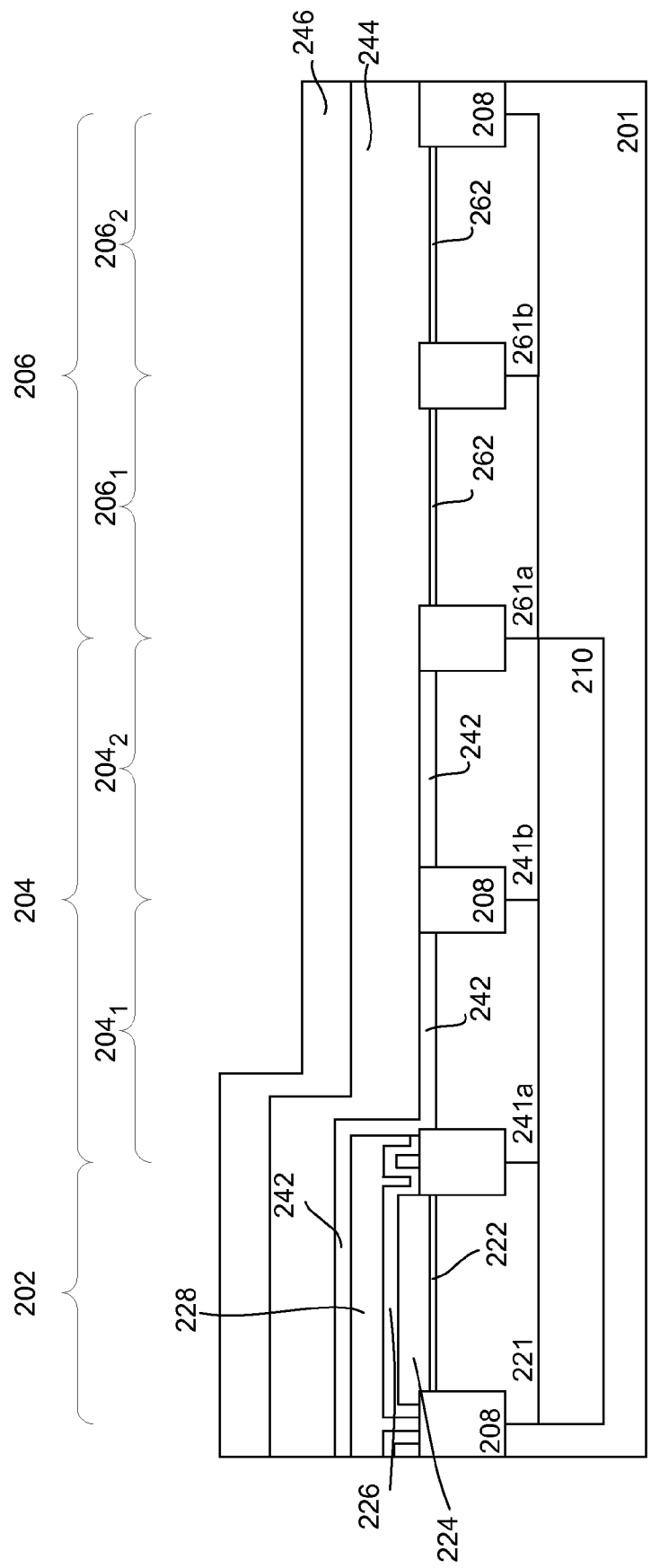

Referring to FIG. 12, a third gate dielectric layer 262 is formed over the logic region. In one embodiment, the third gate dielectric layer includes silicon oxide. Other types of dielectric materials, such as high k dielectric materials may also be useful. The thickness of the third gate dielectric layer may be about 10-70 Å. Other thicknesses may also be useful. The thickness, for example, may depend on the gate voltage application. In one embodiment, the third gate dielectric layer is formed by thermal oxidation or RTO. Thermal oxidation or RTO selectively forms the third gate dielectric layer on the exposed logic region of the substrate. Other techniques may also be used to form the third gate dielectric layer.

As shown in FIG. 12, a third gate layer 244 is formed over the substrate. The third gate layer, for example, is formed over the second and third gate dielectric layers. The third gate layer, for example, includes a blanket gate layer. In one embodiment, the third gate layer includes polysilicon. The polysilicon gate layer can be formed by chemical vapor deposition (CVD). The polysilicon layer may be doped with dopants such as B, P, As, $BF_2$, etc., or a combination thereof, to form a doped polysilicon to impart a higher conductivity to the gate. Other materials and techniques may also be used to form the third gate layer. The thickness of the third gate layer is, for example, about 500-1800 Å. For example, the thickness of the third gate layer is about 800 Å. Other thicknesses may also be useful.

A dummy processing layer or a hard mask layer 246 is formed on top of the third gate layer. The dummy processing layer, for example, includes a blanket dummy layer. In one embodiment, the dummy layer includes silicon nitride. The dummy layer can be formed by chemical vapor deposition (CVD). Other materials and techniques may also be used to form the dummy processing layer. The thickness of the dummy layer is, for example, about 300-1000 Å. Other suitable thickness dimensions may also be useful.

Figure 13:
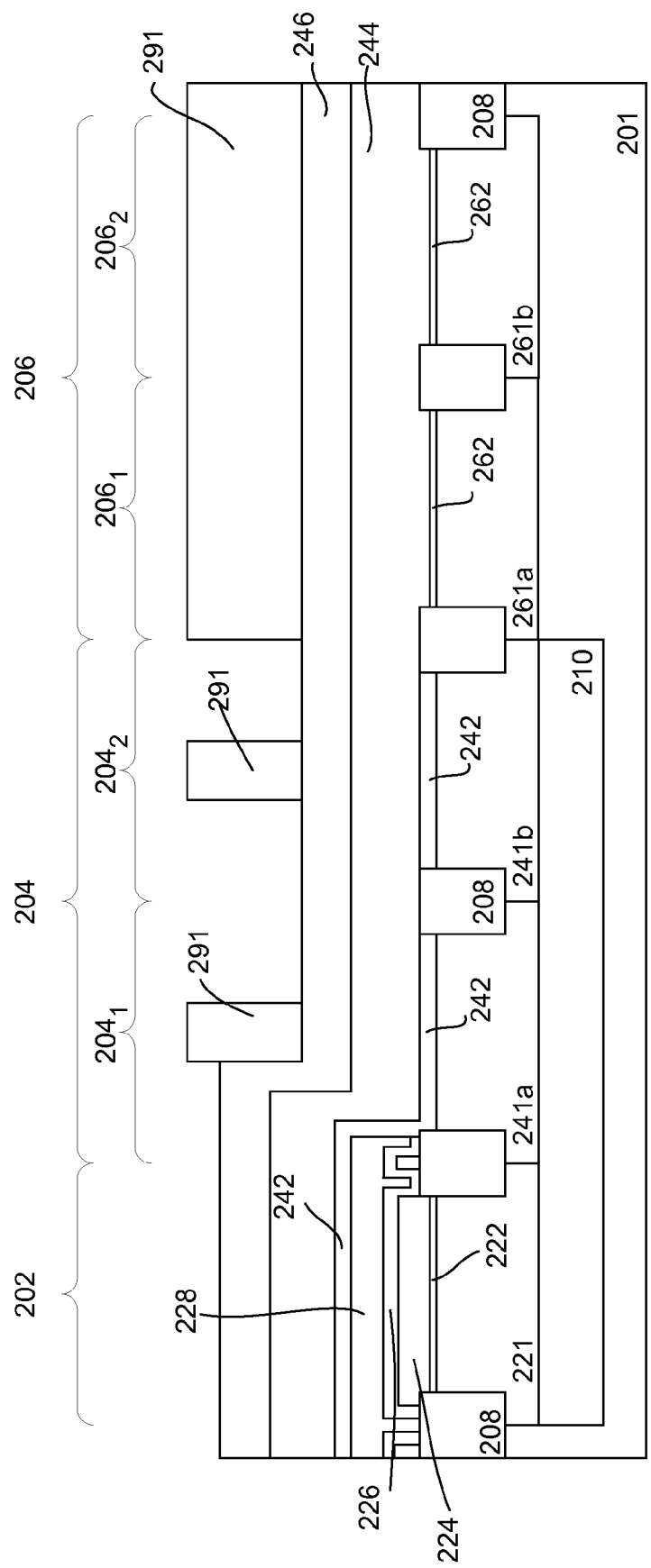
Figure 14:
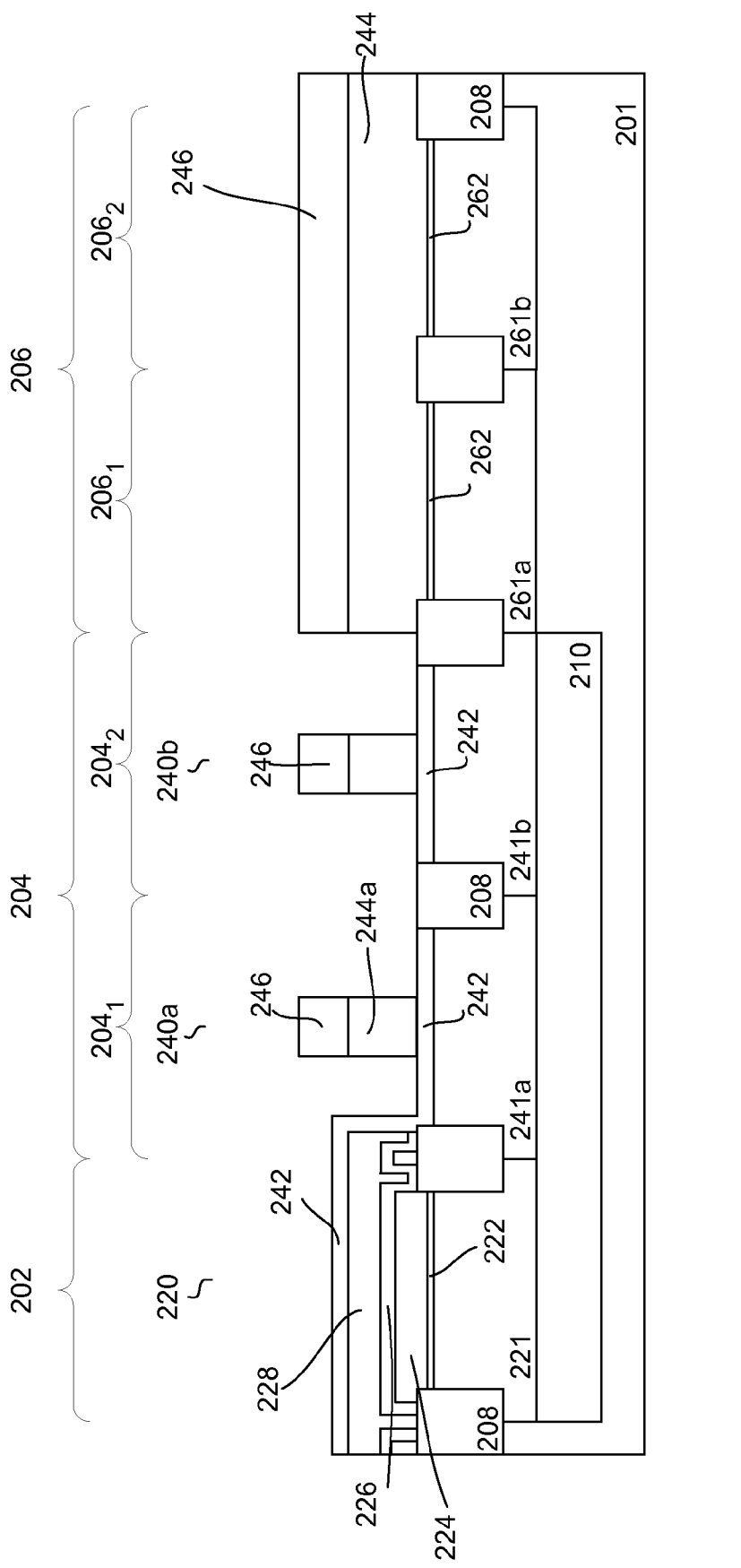

Referring to FIG. 13, a seventh mask layer 291 is formed on the substrate and patterned. The mask layer is patterned to expose portions of the third gate and dummy layers to be removed. The mask layer, for example, protects at least portions corresponding to gate stacks of the HV devices and the third gate and dummy layers of the logic devices. For example, the mask serves as a HV gate mask. The exposed portions of the third gate and dummy layers on the memory cell and peripheral circuit regions are removed to form at least the gate stacks of the HV devices as shown in FIG. 14. Removal can be achieved using, for example, an anisotropic etch such as RIE. The etch is preferably selective to the second gate dielectric layer. Other techniques may also be useful. The seventh mask layer is removed after etching.

Figure 15:
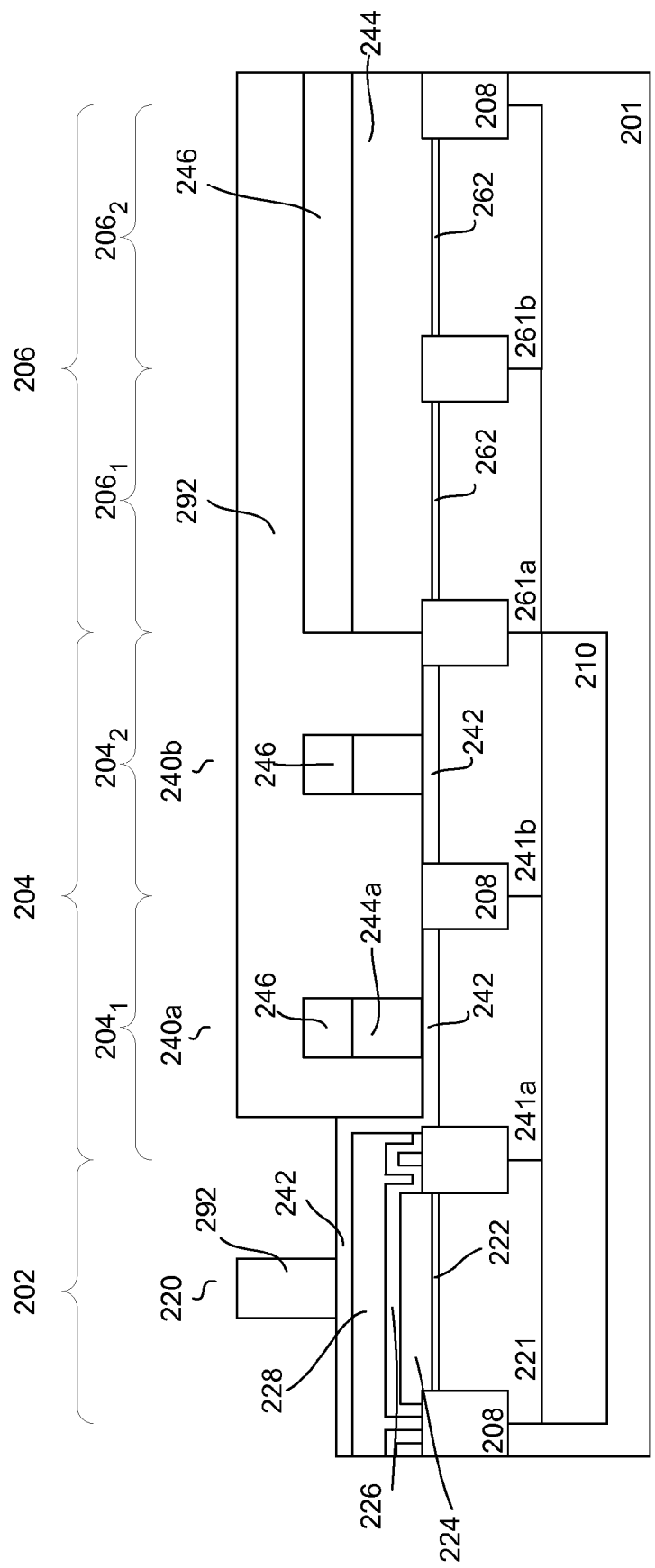
Figure 16:
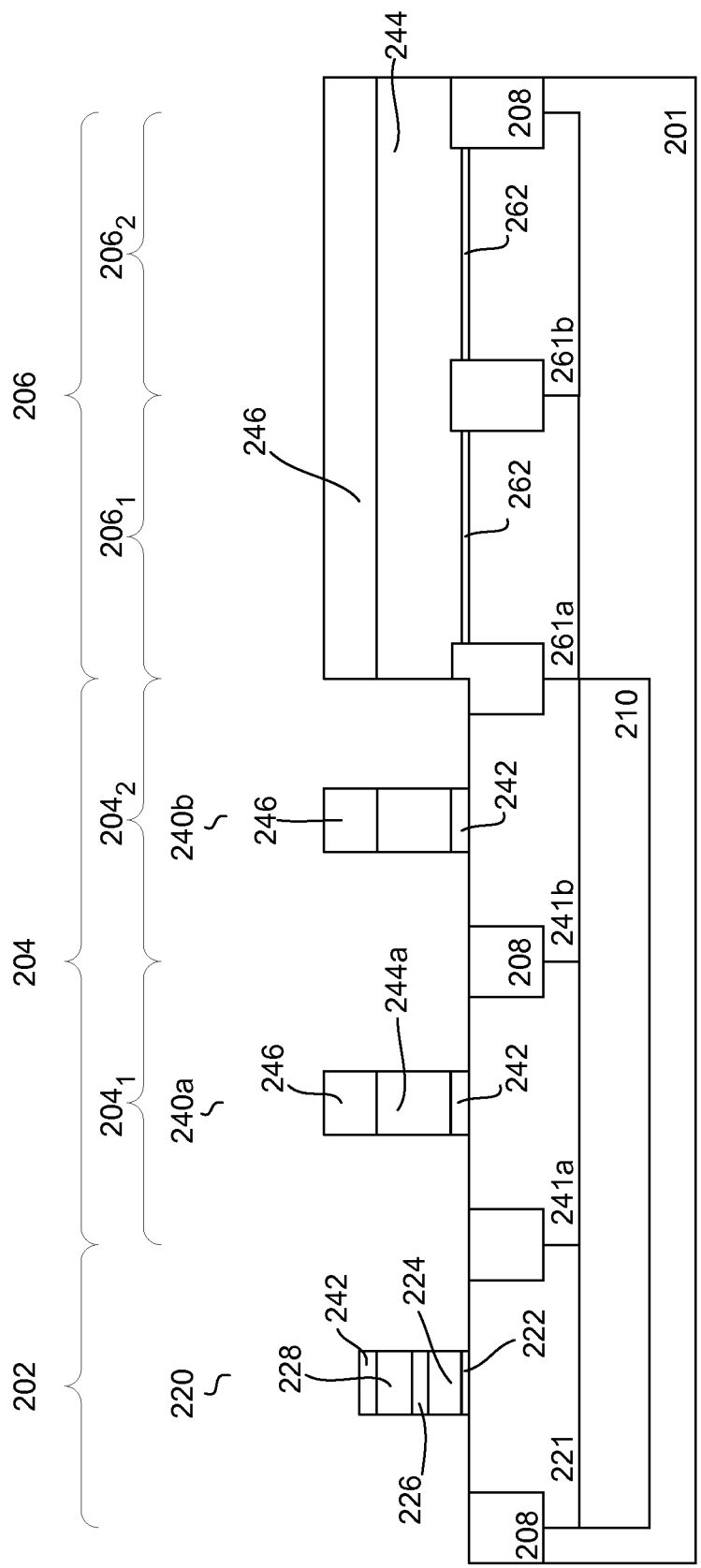

An eighth mask layer 292 is formed on the substrate and patterned as shown in FIG. 15. The eighth mask layer is patterned to expose portions of the first and second gate, first and second gate dielectric and the isolation layers on the memory cell region. The eighth mask layer protects at least portions corresponding to gate stack of the memory cell. For example, the mask serves as a memory cell gate mask. The exposed portions of the first and second gate and the isolation layers are removed to form at least the gate stack of the memory cell as shown in FIG. 16. Removal can be achieved using, for example, an anisotropic etch such as RIE. The etch is preferably selective to the substrate. Other techniques may also be useful. As shown in FIG. 16, the eighth mask layer is removed after etching.

Figure 17:
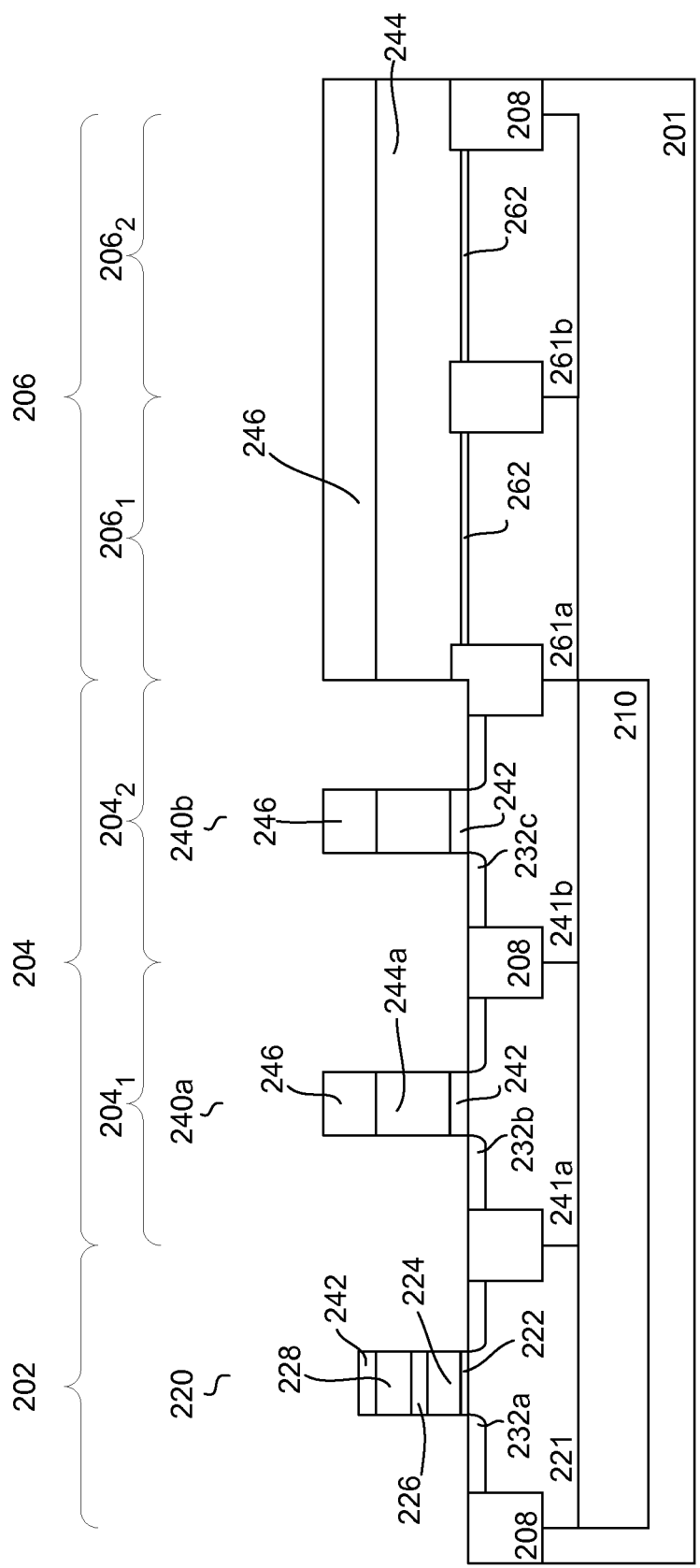

Referring to FIG. 17, first and second extension or lightly doped diffusion regions are formed on the substrate adjacent to the memory cell and HV gate stacks. In one embodiment, dopants of the opposite type as the type of the well are implanted. In the case of a first type memory cell well, the diffusion regions 232a include a second type. The extension diffusion regions 232a-c, for example, are formed using techniques such as ion implantation. For illustration, n-type dopants are implanted to form the first and second extension diffusion regions for a p-type memory cell well. For example, n-type dopants, such as As, P, etc., or a combination thereof, are implanted into p-type memory cell well. The p-type memory cell well, for example, is implanted with n-type dopants having a dopant concentration of about $10^{18}$-$10^{19}$ atom/cm³ and to a depth of about 200-800 Å from the first substrate surface. Other concentrations or depth dimensions may also be useful.

As shown, the dummy processing layers on top of the gate electrodes 244a of the second region elevates the height of the HV gate stacks. This enables high energy implant to be performed to form the extension regions in the second region. High energy implant increases the breakdown voltage of the HV transistors.

Figure 18:
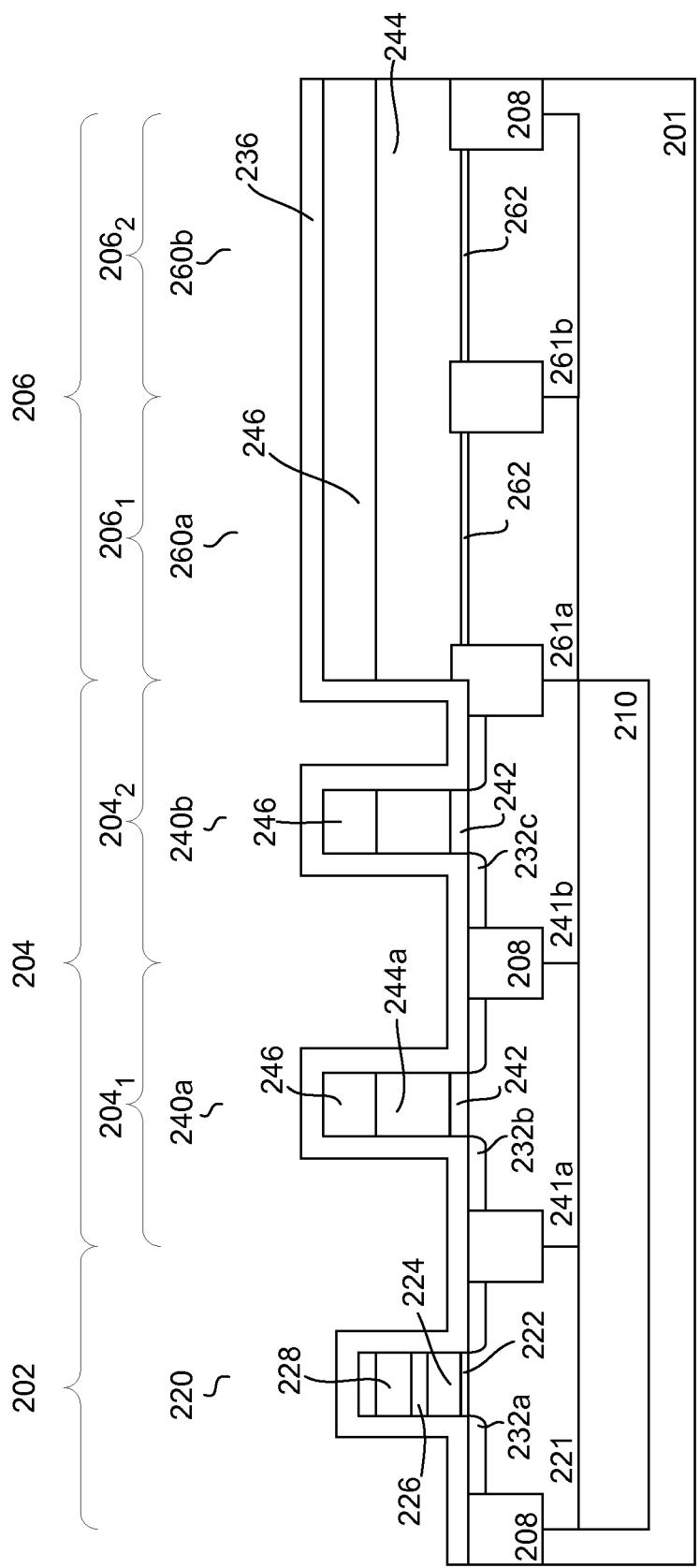
Figure 19:
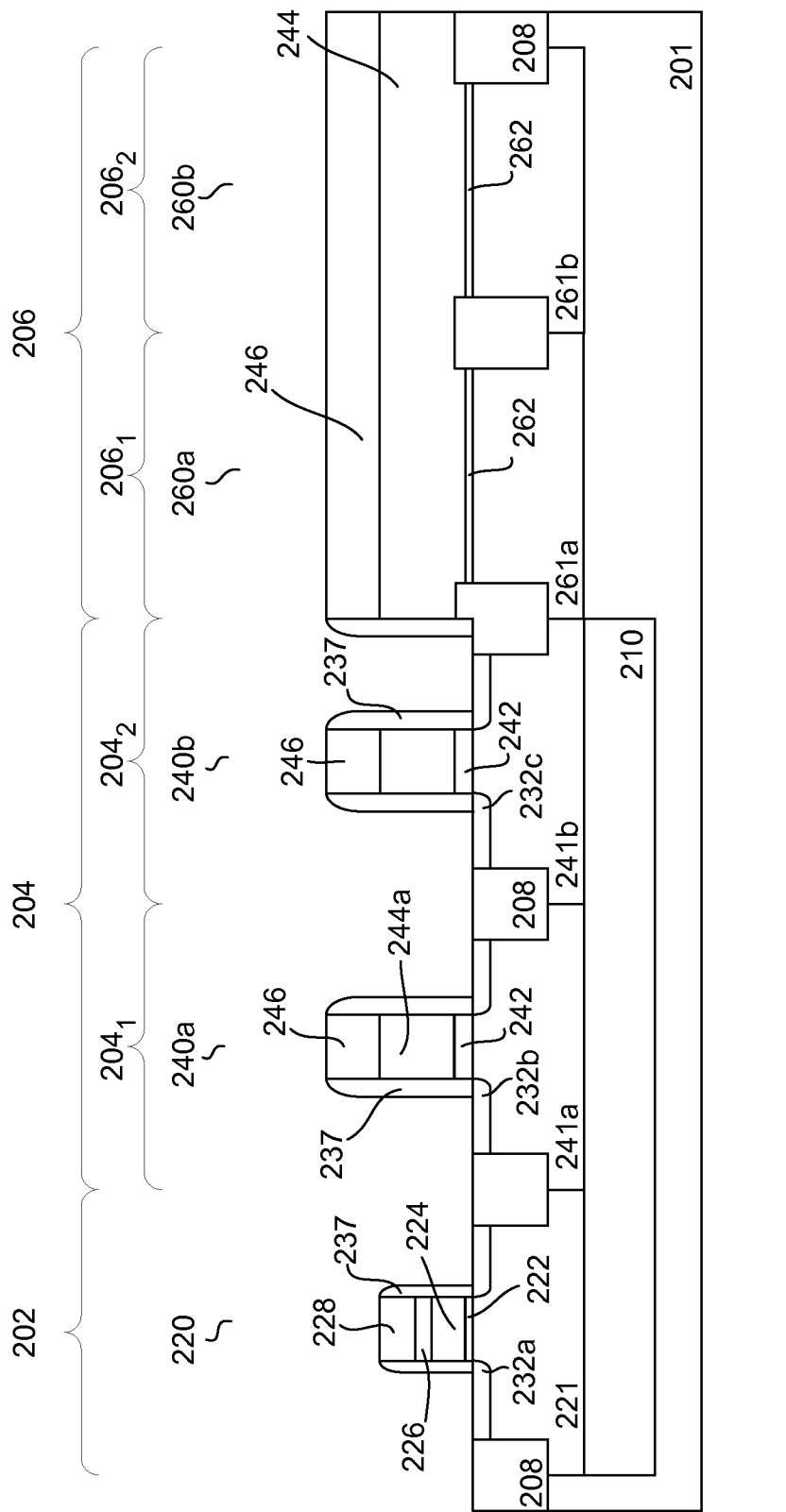

The process continues to form first spacer elements on sidewalls of the resulting structures. Referring to FIG. 18, a first spacer layer 236 is formed over the resulting structures on the first, second and third regions of the substrate. The first spacer layer, in one embodiment, includes a material which is different than the dummy processing or hard mask layer. The first spacer layer, for example, includes a dielectric material such as oxide. Other materials may also be used. The first spacer layer, for example, is formed by depositing a blanket first dielectric layer on the substrate and the resulting structures as shown in FIG. 18. The first spacer layer is then patterned to remove the horizontal portions, including the second gate dielectric layer on top of the gate stack of the memory cell and on top of the substrate in the peripheral circuit region. Removal can be achieved, for example, using an anisotropic etch, such as RIE. First spacer elements 237 are formed on the sidewalls of the memory cell and HV gate stacks and the resulting structure on the logic region as shown in FIG. 19. The thickness of the first spacer elements, for example, is about 300-1000 Å. The width of the first spacer elements, for example, is about 300-800 Å. Other thicknesses and width dimensions are also useful so long as the first spacer includes an effective spacer width is sufficiently wide to achieve the required or higher HV breakdown voltage.

Figure 20:
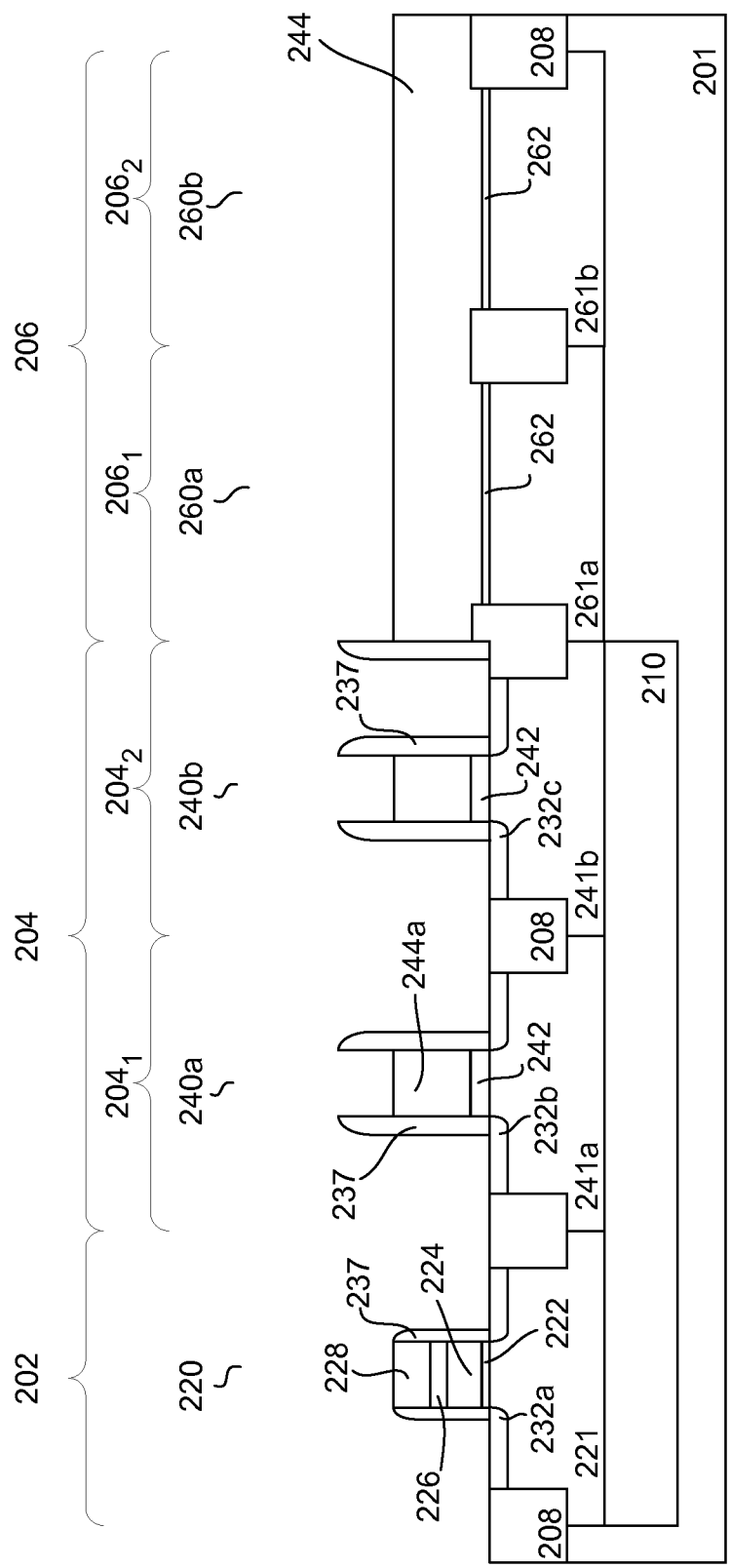

Referring to FIG. 20, the dummy processing layers on top of the third gate layer of the HV gate stack and the logic gate structure are removed. Removal of the dummy processing layers can be achieved using an etch process, such as RIE. The dummy processing layer having nitride material, for example, may be etched with high selectivity to the first sidewall spacer having oxide material. Other techniques may also be useful. Removal of the dummy processing layers exposes the third gate layers on the peripheral circuit and logic regions. As shown, the first sidewall elements of the HV gate stacks and logic gate structure include top surfaces which are non co-planar with the third gate layers. For example, the top surfaces of the first sidewall elements of the HV gate stacks and logic gate structure are above the top surfaces of the third gate layers.

Figure 21:
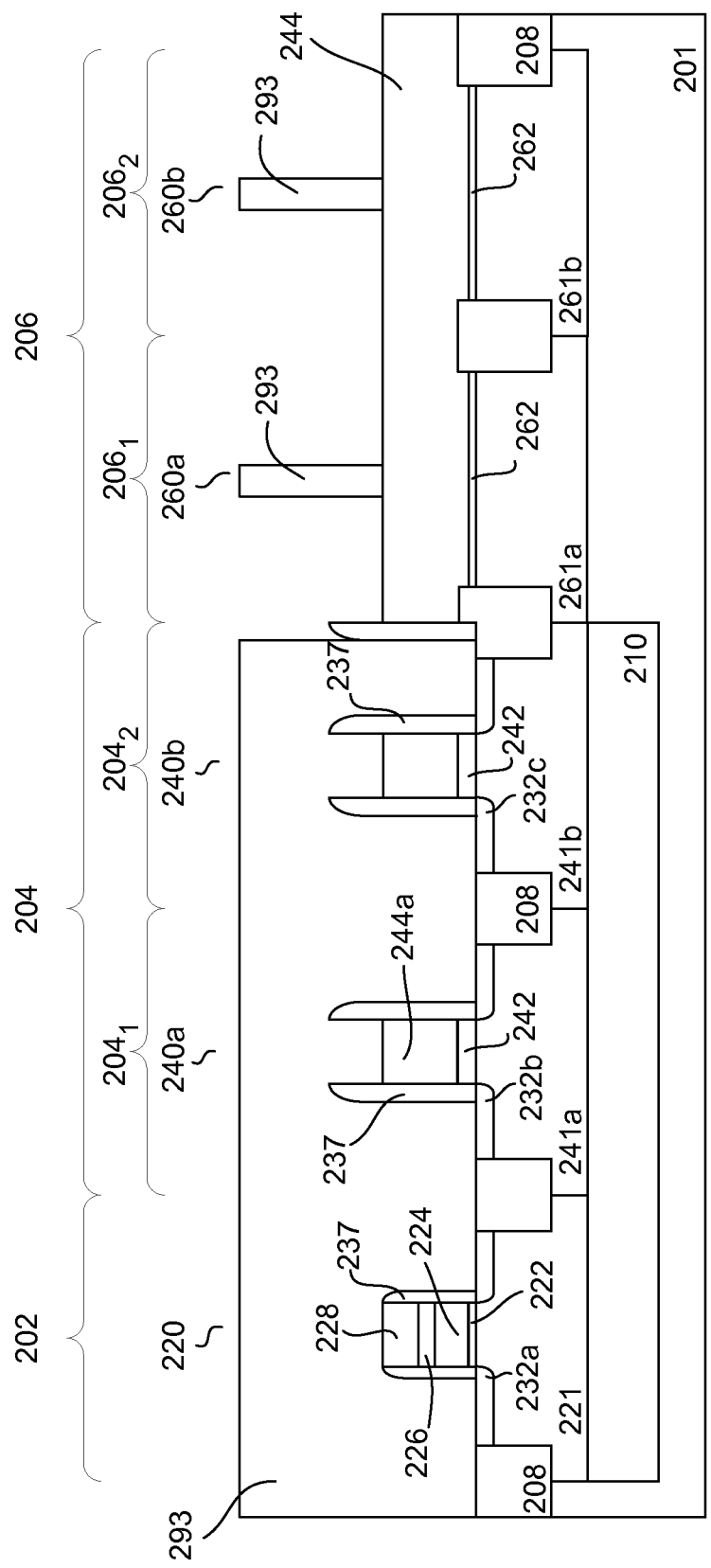
Figure 22:
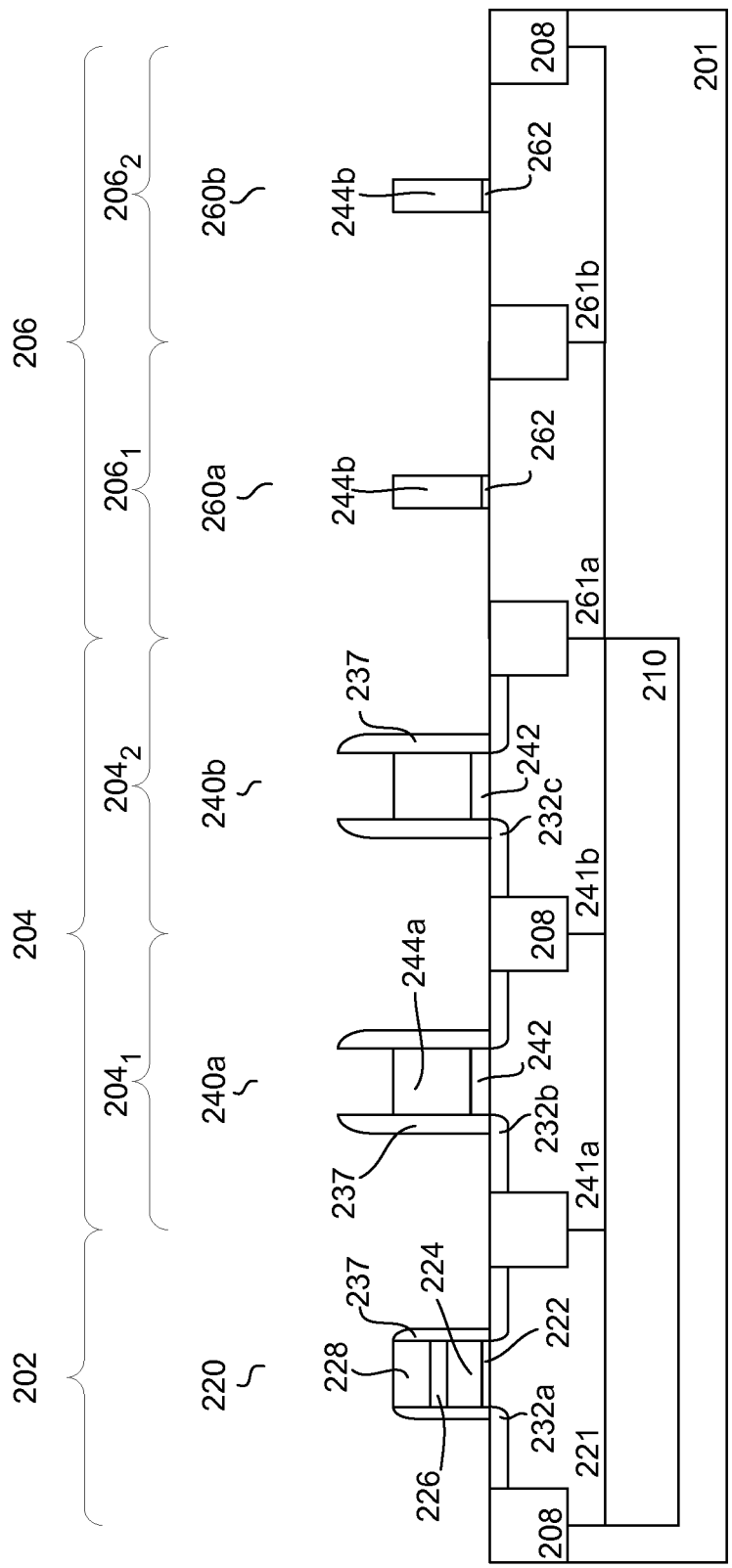

A ninth mask layer 293 is formed on the substrate and patterned as shown in FIG. 21. The ninth mask layer is patterned to expose portions of the third gate layer on the logic region. The ninth mask layer protects at least portions corresponding to gate stack 244*b* of the logic device. For example, the mask serves as a logic gate mask. The exposed portions of the third gate layer are removed to form at least the gate stacks of the logic devices as shown in FIG. 22. Removal can be achieved using, for example, an anisotropic etch such as RIE. The etch is preferably selective to the substrate. Other techniques may also be useful. As shown in FIG. 22, the ninth mask layer is removed after etching.

Figure 23:
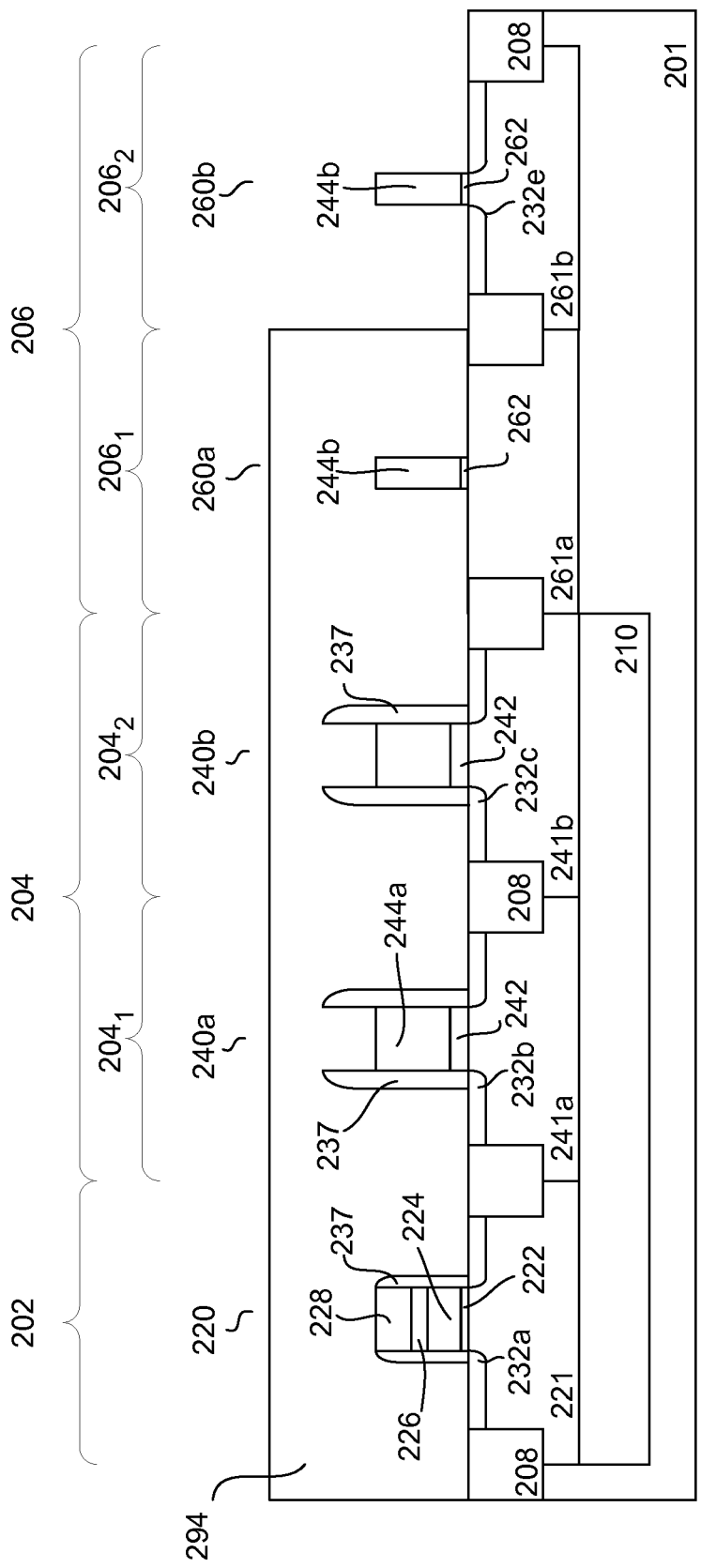

Referring to FIG. 23, a tenth mask layer 294 is provided over the substrate. The tenth soft mask is patterned to form an opening to expose the second sub-region 206$_2$ of the third region. In one embodiment, the opening corresponds to the opening for first and second lightly doped diffusion regions 232*e* implant for the second sub-region. As shown in FIG. 22, the substrate is implanted with first type dopants in a second type logic well. For example, p-type dopants, such as B, BF$_2$, etc., or a combination thereof, are implanted into n-type logic well. The n-type logic well, for example, is implanted with p-type dopants. Providing other types of dopants, various concentration and depths may also be useful, depending on design requirements and technology node. The tenth soft mask layer is removed. The tenth soft mask layer can be removed by, for example, an ashing process or other suitable techniques.

Figure 24:
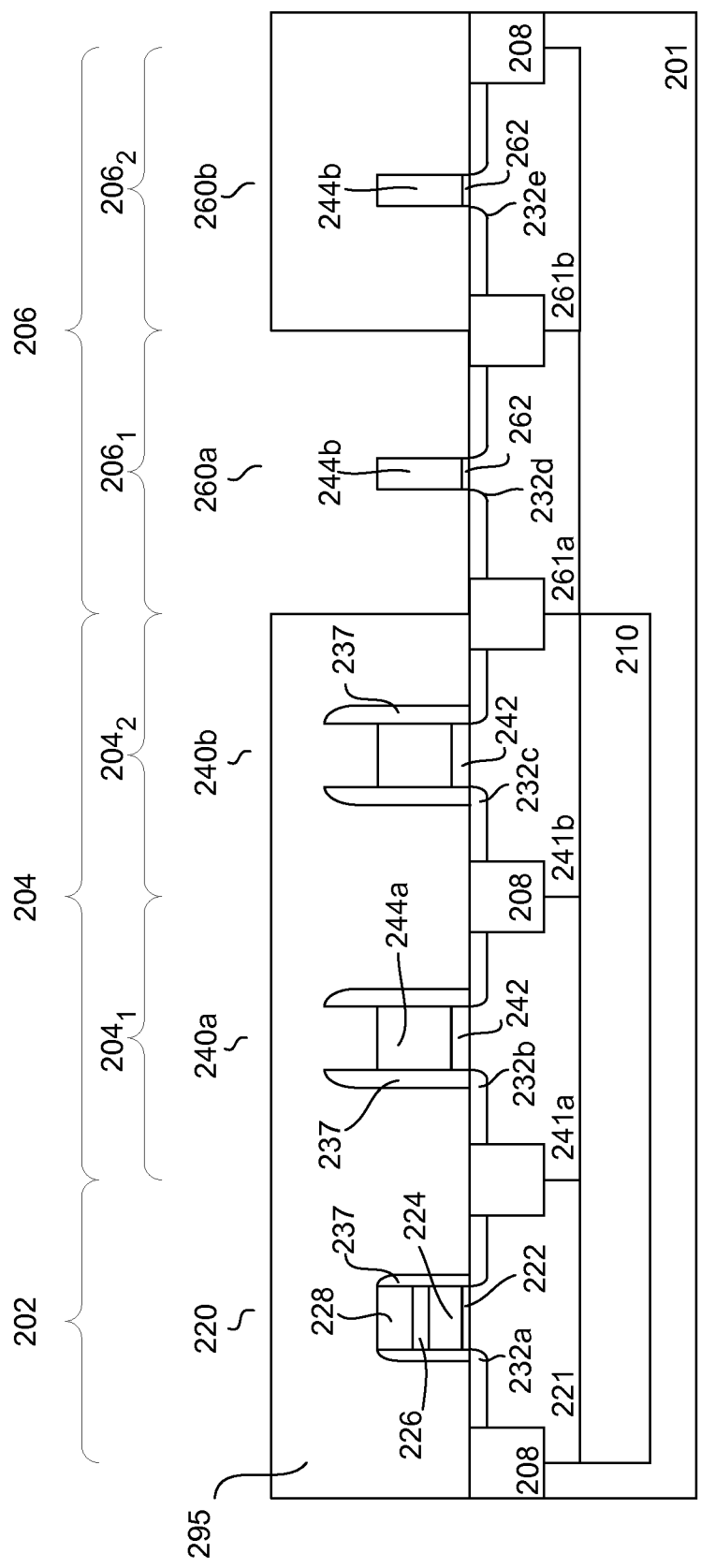
Figure 25:
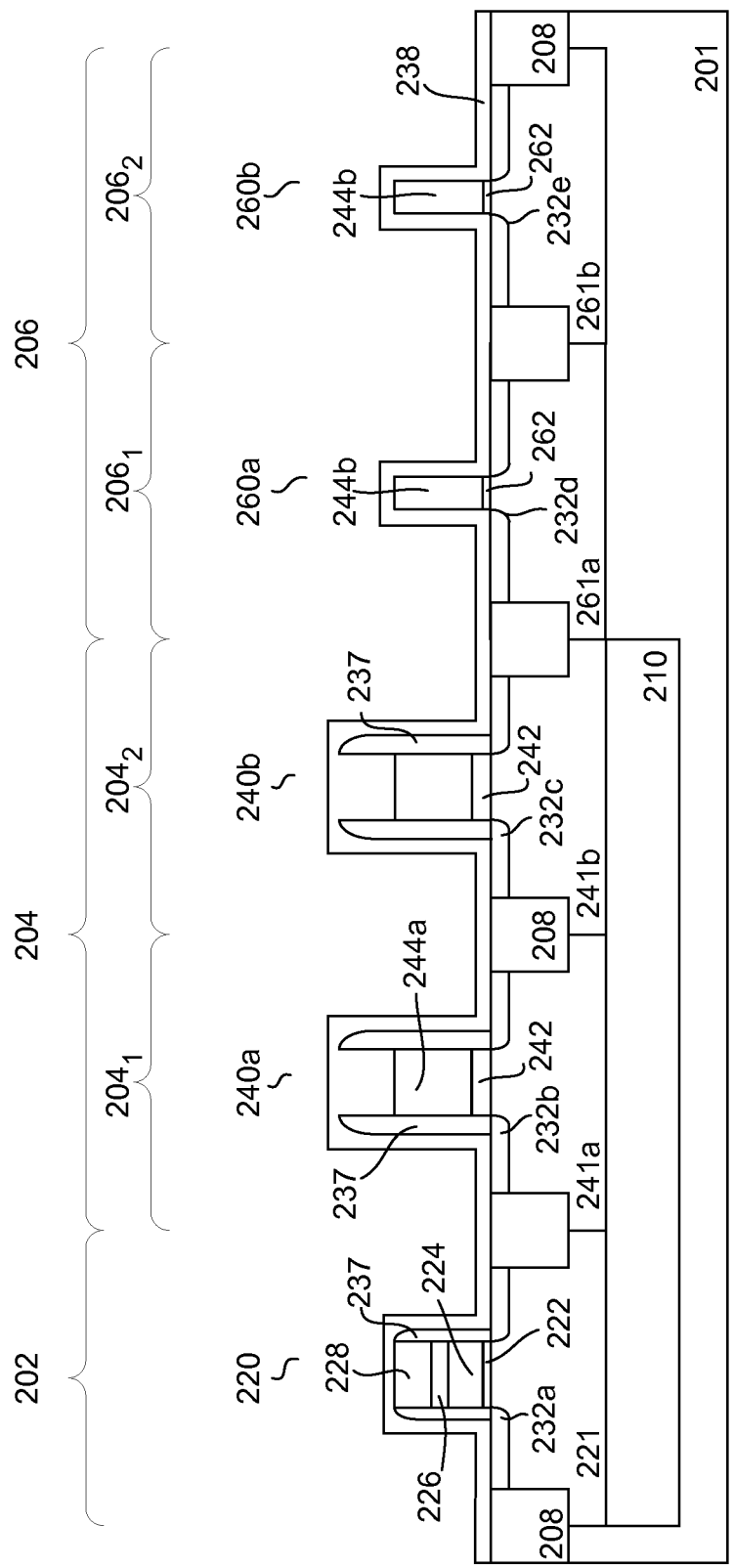

An eleventh mask layer 295 is provided over the substrate as shown in FIG. 24. The eleventh soft mask is patterned to form an opening to expose the first sub-region 206$_1$ of the third region. In one embodiment, the opening corresponds to the opening for first and second lightly doped diffusion regions 232*d* implant for the first sub-region. As shown in FIG. 23, the substrate is implanted with second type dopants in a first type logic well. For example, n-type dopants are implanted into p-type logic well. Providing other types of dopants, various concentration and depths may also be useful, depending on design requirements and technology node. The eleventh soft mask layer is removed. The eleventh soft mask layer can be removed by, for example, an ashing process or other suitable techniques.

Figure 26:
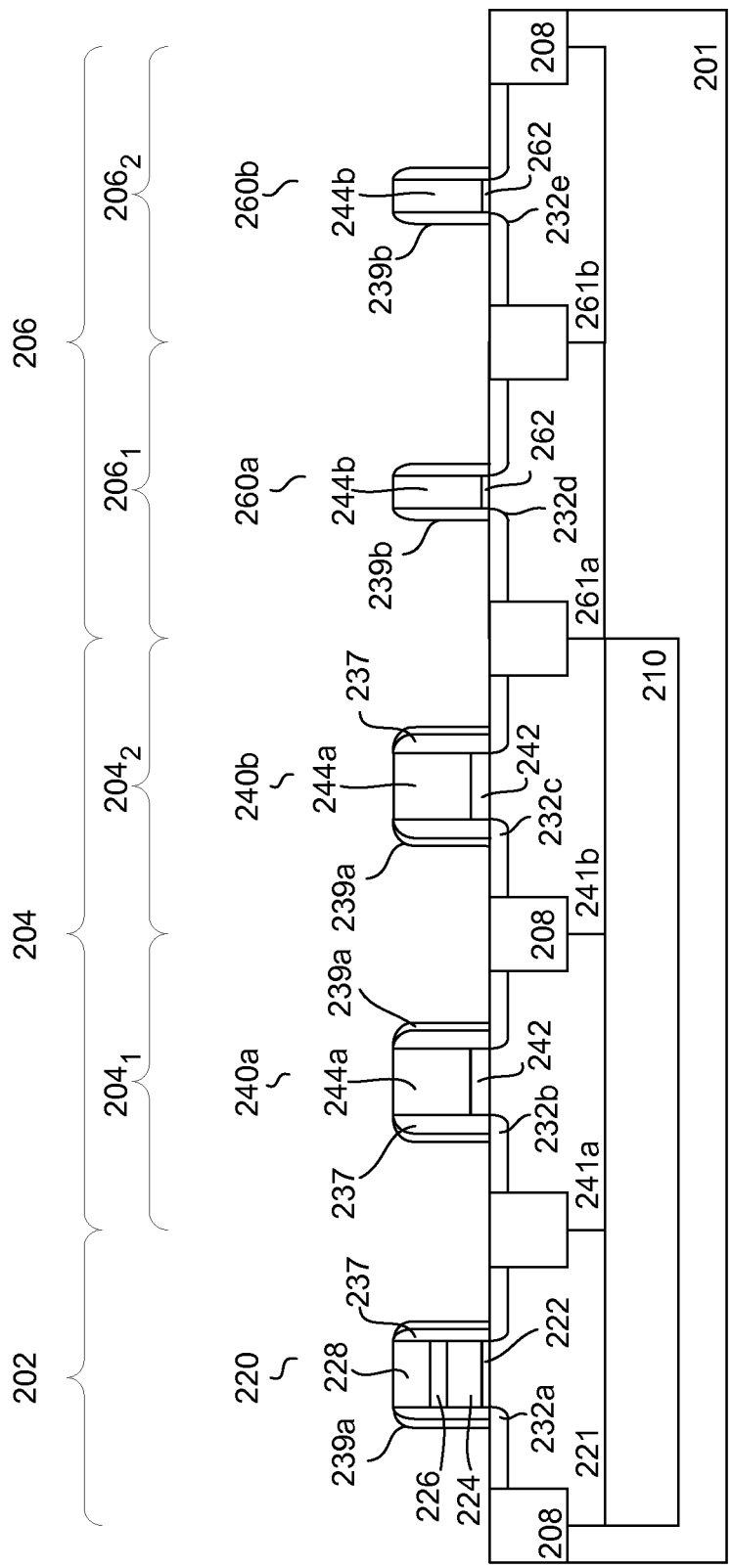

The process continues to form second spacer elements on sidewalls of the memory cell and HV gate stacks and to form first spacer elements on sidewalls of the logic gate stack. Referring to FIG. 24, a second spacer layer 238 is formed over the resulting structures on the first, second and third regions of the substrate. The second spacer layer, for example, includes a dielectric material such as oxide, nitride or a combination thereof. The second spacer layer, may also include multiple layers, such as ON or ONO layers. Other materials may also be used. The second spacer layer, for example, is formed by depositing a blanket second spacer layer on the substrate and the resulting structures is shown in FIG. 24. The second spacer layer is then patterned to remove the horizontal portions. Removal can be achieved, for example, using an anisotropic etch, such as RIE. Second spacer elements 239*a* are formed on the sidewalls of the memory cell and HV gate stacks and first spacer elements 239*b* are formed on the sidewalls of the logic gate stacks as shown in FIG. 26. The thickness of the spacer elements as formed, for example, is about 200-800 Å. Other thicknesses are also useful.

Figure 27:
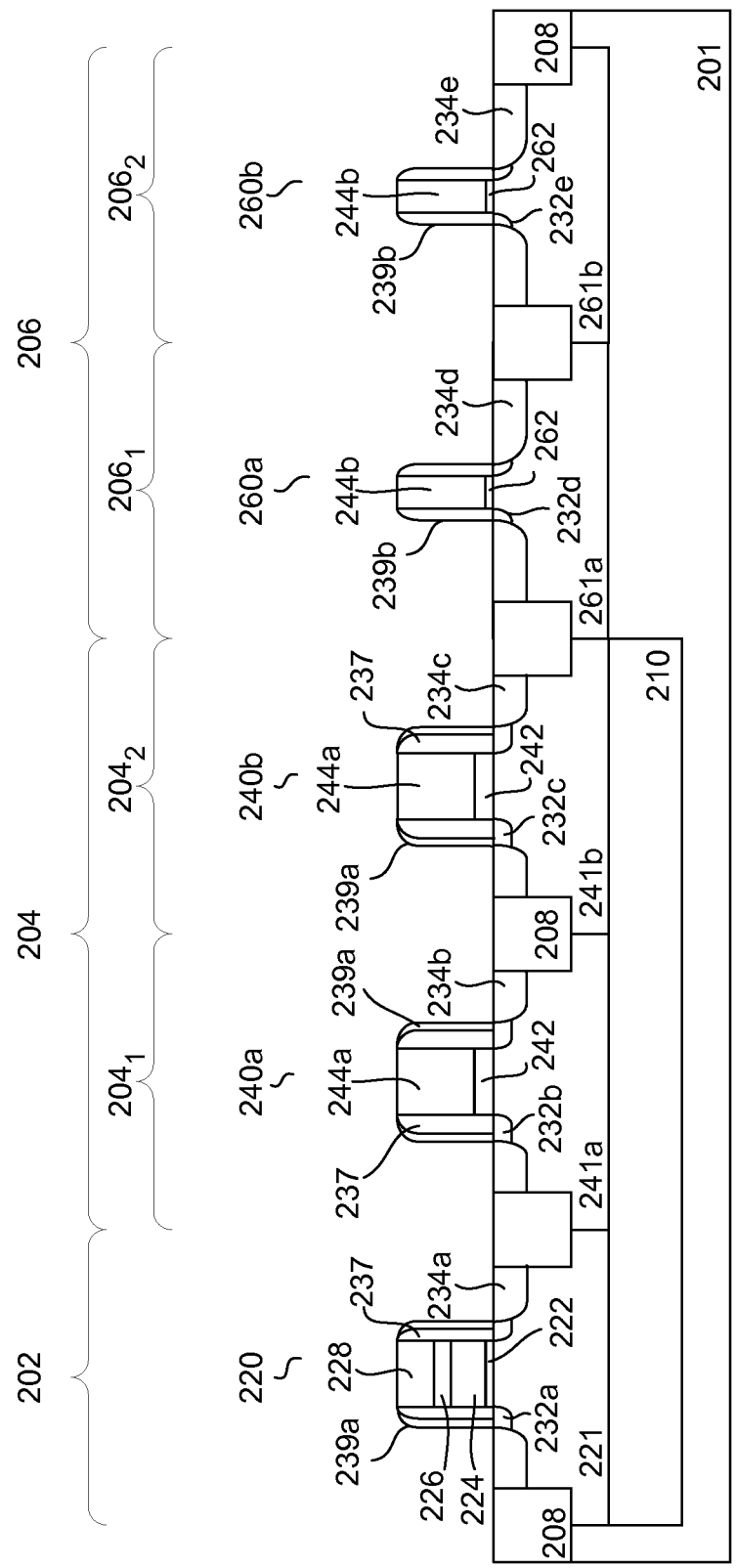

Referring to FIG. 27, first and second heavily doped diffusion regions 234*a-e* are formed on the substrate adjacent to the memory cell, HV and logic gate stacks. In one embodiment, dopants of the opposite type as the type of the well are implanted. In the case of a first type memory cell well, the diffusion regions include a second type. The heavily doped diffusion regions, for example, are formed using techniques such as ion implantation. For illustration, n-type dopants are implanted to form the first and second heavily doped diffusion regions for a p-type memory cell well. For example, n-type dopants, such as P, As, etc., or a combination thereof, are implanted into p-type memory cell well. The p-type memory cell well, for example, is implanted with n-type dopants having a dopant concentration of about $10^{20}$-$10^{22}$ atom/cm$^3$ and to a depth of about 50-300 Å from the first substrate surface.

Figure 28:
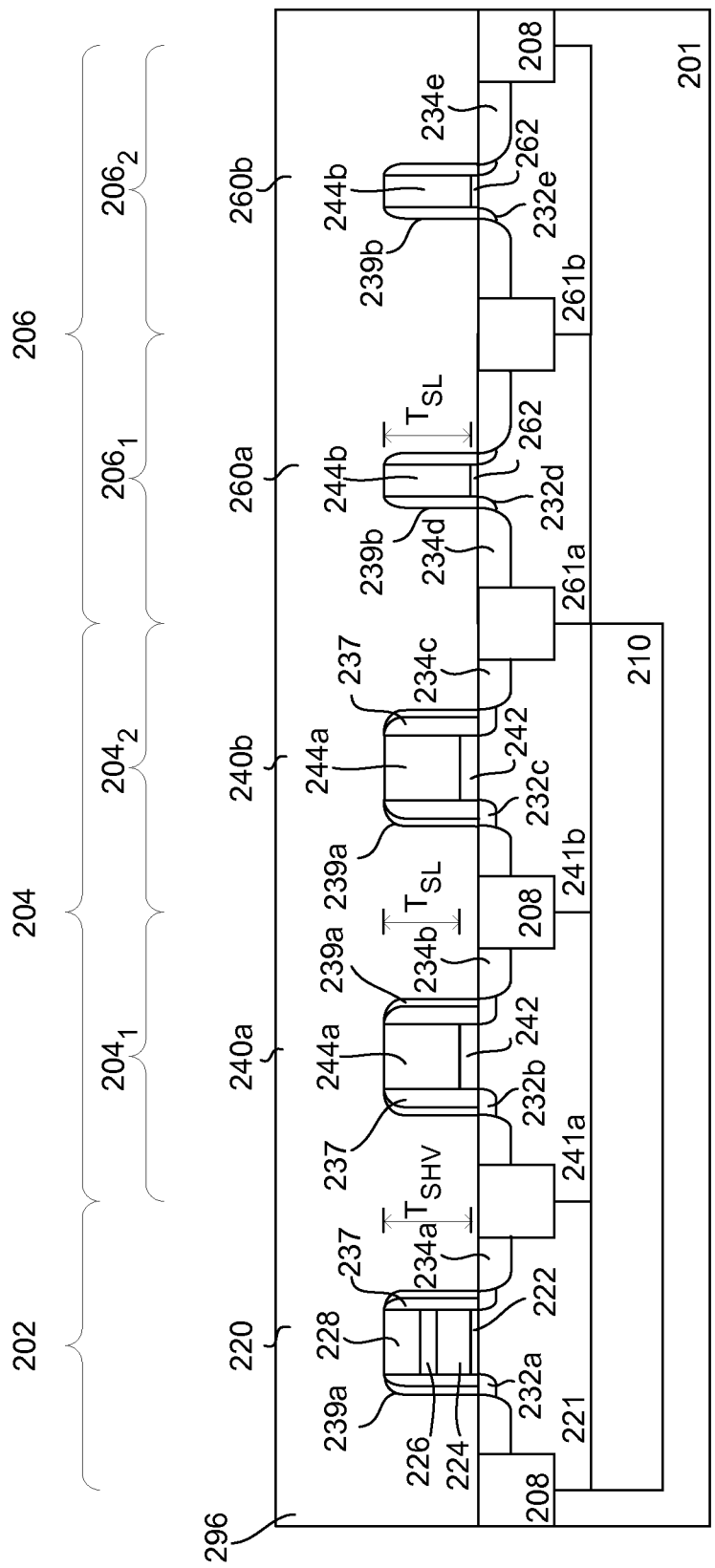

The process continues by forming interconnections to the diffusion regions and gates of the transistors. For example, an interlevel dielectric (ILD) layer 296 is deposited over the substrate as shown in FIG. 28 and contact openings (not shown) are formed through the ILD layer to form interconnections. The diffusion regions and gates, for example, are appropriately coupled to source lines, bit lines, access lines and control lines. Additional processes are performed to complete the IC. These processes include, for example, final passivation, dicing and packaging.

Miniaturization of logic transistors to the 65 nm technology node and beyond requires the memory cell and HV devices integrated therein to shrink as well. For example, the gate electrodes of the memory and HV devices have to be reduced to accommodate for the reduced logic transistor. The embodiments as described enable integration of these different devices without degrading the performances of the respective device type. For example, the high voltage wet oxidation as described enables the CG to be uniformly thinned. Moreover, the stack height of the memory cell ($T_{SM}$), the HV transistor ($T_{SHV}$) and the logic transistor ($T_{SL}$) are substantially the same across the same substrate of the semiconductor device. The stack height variance between the different devices as described in the embodiments, for example, is less than or about 10%. For illustration purpose, the stack height variance between the memory, HV and logic devices with respect to the embodiments as described is relatively small, for example, less than or about 100 Å. As such, the memory cell can be easily integrated into existing or other logic processing technologies. By forming memory cell and HV transistors having substantially the same stack height as the logic transistors, additional steps to alter the logic processes which are common to all other device processes, such as contact etch, ILD and interconnect formations, are avoided. In addition, the process margin in the memory region is improved due to much smaller ILD aspect ratio with greatly decreased memory stack height, thus potentially shrinks the cell bit size further.

Moreover, the use of the dummy processing layer elevates the height of the HV devices during processing. The dummy processing layer as described has sufficient thickness for high energy implant to form the extension diffusion regions. The use of the dummy processing layer also causes the effective spacer width of the first spacer elements to be increased by 50-100% (depending on the thickness of the dummy processing layer) compared to conventional design. The first spacer elements of the HV transistors as described thus include an increased effective spacer width which effectively prevents or reduces the number of ions from penetrating the substrate adjacent to the gate of the HV devices during high energy implant. Both high energy implant and the effective spacer width enable higher breakdown voltage for the HV devices to be achieved to satisfy the requirements of the memory cell. As such, the reliability of the HV transistors is not compromised even though the thickness of the gate electrode of the HV transistor is reduced to accommodate for miniaturization. The high breakdown voltage also alleviates the concern of reduced CG to FG coupling ratio due to a thinner FG. The reduced FG capacitance requires fewer electrons to be programmed and erased through the tunneling oxide to get the same voltage window. As such, the memory reliability and the data retention capabilities of the memory cell are improved. Accordingly, the embodiments as described provide a reliable, high performing and simplified solution for integrating different types of devices in the same IC.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A device comprising:
   a substrate having first, second and third regions, the first region includes a memory cell region, the second region includes a peripheral circuit region and the third region includes a logic region;
   a memory cell disposed in the first region, wherein
   the memory cell comprises a memory transistor which includes a floating gate transistor having a first stack height ($T_{SM}$), the floating gate transistor includes a first gate electrode over a first gate dielectric layer on the substrate, a second electrode over the first gate electrode with an isolation layer in between the first and second gate electrodes, and
   the $T_{SM}$ is defined by a total thickness of the first gate electrode, isolation layer and the final thickness of the second gate electrode;
   a high voltage (HV) transistor disposed in the second region, wherein
   the HV transistor having a second stack height ($T_{SHV}$), the HV transistor includes a single layer HV gate electrode over and contacts a HV gate dielectric on the substrate, and
   the $T_{SHV}$ is defined by a thickness of the single layer HV gate electrode;
   a logic transistor disposed in the third region, wherein
   the logic transistor having a third stack height ($T_{SL}$), the logic transistor includes a single layer logic gate electrode over and contacts a logic gate dielectric on the substrate, and
   the $T_{SL}$ is defined by a thickness of the single layer logic gate electrode; and
   an interlevel dielectric (ILD) layer disposed over the substrate, wherein the ILD contacts top surfaces of the second gate electrode of the floating gate transistor, the single layer HV gate electrode and the single layer logic gate electrode, and
   wherein the first, second and third stack heights are substantially the same across the substrate.

2. The device of claim 1 wherein the second gate electrode includes a heavily doped polysilicon layer.

3. The device of claim 1 wherein the HV transistor includes first spacer elements adjacent to sidewalls of the HV gate electrode, the first spacer elements are substantially wide to achieve a desired HV breakdown voltage.

4. The device of claim 1 wherein stack height variance between the memory, HV and logic transistors is less than or about 10%.

5. A method of forming a device comprising:
   providing a substrate having first, second and third regions, the first region includes a memory cell region, the second region includes a peripheral circuit region and the third region includes a logic region;
   forming a memory cell in the first region, wherein the memory cell includes a memory transistor having a first stack height ($T_{SM}$);
   forming a high voltage (HV) transistor in the second region, wherein the HV transistor has a second stack height ($T_{SHV}$); and
   forming a logic transistor in the third region, the logic transistor has a third stack height ($T_{SL}$), wherein
   the first, second and third stack heights are substantially the same across the substrate, and
   forming the memory cell HV transistor and logic transistor comprises
   providing a protection stack having first and second protection layers over the third region of the substrate,
   forming a first gate dielectric layer over the substrate, wherein the first gate dielectric layer is selectively-grown on the first and second regions of the substrate, and
   forming a first gate electrode layer over the first date dielectric layer and the protection stack.

6. The method of claim 5 wherein the first protection layer includes silicon oxide formed on the substrate and the second protection layer includes silicon nitride formed over the silicon oxide.

7. The method of claim 5 wherein forming the memory cell, HV transistor and logic transistor further comprises:
  forming an isolation layer over the first gate electrode layer;
  forming a second gate electrode layer over the isolation layer; and
  patterning the first and second gate electrode layers and the isolation layer to form an interim gate structure over the first region of the substrate.

8. The method of claim 7 wherein forming the memory cell, HV transistor and logic transistor comprises:
  removing the second protection layer of the protection stack; and
  forming a second gate dielectric layer having varying thicknesses over the first, second and third regions of the substrate, wherein the second gate dielectric layer is formed by a high temperature wet oxidation technique.

9. The method of claim 8 wherein the thickness of the second gate dielectric layer over the second gate layer on the first region is the thickest and the thickness of the second gate dielectric layer over the third region is the thinnest relative to the other regions.

10. The method of claim 8 wherein forming the memory cell, HV transistor and logic transistor comprises:
  removing the first protection layer of the protection stack and the second gate dielectric layer on the third region of the substrate; and
  forming a third gate dielectric layer over the third region of the substrate.

11. The method of claim 10 wherein forming the memory cell, HV transistor and logic transistor comprises:
  forming a third gate electrode layer over the second and third gate dielectric layers; and
  forming a dummy processing layer over the third gate electrode layer.

12. The method of claim 11 wherein the dummy processing layer includes silicon nitride.

13. The method of claim 11 wherein forming the memory cell, HV transistor and logic transistor comprises:
  patterning the dummy processing and the third gate electrode layers over the second region of the substrate to form gate stack of the HV transistor, wherein the patterned dummy processing layer elevates the height of the HV gate stack for high energy implant for forming extension regions in the second region of the substrate.

14. The method of claim 13 wherein forming the memory cell, HV transistor and logic transistor comprises:
  forming first spacer elements on sidewalls of the gate stack of the HV transistor, wherein the first spacer elements are substantially wide to achieve a desired HV breakdown voltage.

15. The method of claim 13 wherein forming the memory cell, HV transistor and logic transistor comprises patterning portions of the first and second gate electrode, first and second gate dielectric and the isolation layers on the first region to form gate stack of the memory transistor prior to forming the first spacer elements.

16. The method of claim 15 wherein the first spacer elements are also formed on sidewalls of the gate stack of the memory transistor.

17. The method of claim 16 wherein forming the memory cell, HV transistor and logic transistor comprises:
  removing the dummy processing layers on top of the third gate electrode layers of the MV gate stack and on the third region; and
  patterning portions of the third gate layer on the third region to form gate stack of the logic transistor.

18. The method of claim 17 wherein forming the memory cell, HV transistor and logic transistor comprises forming second spacer elements over the first spacer elements on sidewalls of the memory and HV gate stacks, wherein the first and second spacer elements comprise different material.

19. The method of claim 18 wherein the second spacer elements are also formed on and directly contact sidewalls of the gate stack of the logic transistor.

20. A method of forming a device comprising:
  providing a substrate having first, second and third regions, the first region includes a memory cell region, the second region includes a peripheral circuit region and the third region includes a logic region;
  forming a memory cell in the first region, wherein
    the memory cell comprises a memory transistor which includes a floating gate transistor having a first stack height ($T_{SM}$), the floating gate transistor includes a first gate electrode over a first gate dielectric layer on the substrate, a second gate electrode over the first gate electrode with an isolation layer in between the first and second gate electrodes, and
    the $T_{SM}$ is defined by a total thickness of the first gate electrode, isolation layer and the final thickness of the second gate electrode;
  forming a high voltage (HV) transistor in the second region, wherein
    the HV transistor has a second stack height ($T_{SHV}$), the HV transistor includes a single layer HV gate electrode over and contacts a HV gate dielectric on the substrate, and
    the $T_{SHV}$ is defined by a thickness of the single layer HV gate electrode;
  forming a logic transistor in the third region, wherein
    the logic transistor has a third stack height ($T_{SL}$), the logic transistor includes a single layer logic gate electrode over and contacts a logic gate dielectric on the substrate, and
    the $T_{SL}$ is defined by a thickness of the single layer logic gate electrode; and
  forming an interlevel dielectric (ILD) layer over the substrate, wherein the ILD contacts top surfaces of the second gate electrode of the floating gate transistor, the single layer HV-gate electrode and the single layer logic gate electrode, and
  wherein the first, second and third stack heights are substantially the same across the substrate.

* * * * *